(12) United States Patent
Shim et al.

(10) Patent No.: US 6,775,140 B2
(45) Date of Patent: Aug. 10, 2004

(54) HEAT SPREADERS, HEAT SPREADER PACKAGES, AND FABRICATION METHODS FOR USE WITH FLIP CHIP SEMICONDUCTOR DEVICES

(75) Inventors: Il Kwon Shim, Singapore (SG); Seng Guan Chow, Singapore (SG); Virgil Cotoco Ararao, Singapore (SG); Sheila Marie L. Alvarez, Singapore (SG); Roger Emigh, Mesa, AZ (US)

(73) Assignee: ST Assembly Test Services Ltd., Singapore (SG)

( * ) Notice: Subject to any disclaimer, the term of this patent is extended or adjusted under 35 U.S.C. 154(b) by 0 days.

(21) Appl. No.: 10/434,256

(22) Filed: May 7, 2003

(65) Prior Publication Data

US 2004/0075987 A1 Apr. 22, 2004

Related U.S. Application Data

(60) Provisional application No. 60/420,488, filed on Oct. 21, 2002.

(51) Int. Cl.[7] ................................................. H05K 7/20
(52) U.S. Cl. ........................ 361/704; 361/717; 361/718; 361/719; 257/706; 257/712
(58) Field of Search .............................. 361/703, 704, 361/707, 709; 257/706, 712; 165/80.2, 185

(56) References Cited

U.S. PATENT DOCUMENTS

| | | | | |
|---|---|---|---|---|
| 5,289,337 | A | | 2/1994 | Aghazadeh et al. ......... 361/718 |
| 5,650,662 | A | | 7/1997 | Edwards et al. ............ 257/700 |
| 6,188,578 | B1 | * | 2/2001 | Lin et al. .................... 361/717 |
| 6,191,360 | B1 | * | 2/2001 | Tao et al. ................... 174/52.4 |
| 6,229,702 | B1 | * | 5/2001 | Tao et al. .................... 361/704 |
| 6,246,115 | B1 | * | 6/2001 | Tang et al. .................. 257/706 |
| 6,251,707 | B1 | | 6/2001 | Bernier et al. .............. 438/122 |
| 6,319,752 | B1 | * | 11/2001 | Tain et al. ................... 438/110 |
| 6,400,014 | B1 | * | 6/2002 | Huang et al. ................ 257/712 |
| 6,432,742 | B1 | * | 8/2002 | Guan et al. ................. 438/106 |
| 6,483,169 | B1 | * | 11/2002 | Tosaya et al. .............. 257/565 |
| 6,512,675 | B1 | * | 1/2003 | Tarter et al. ................ 361/714 |
| 6,552,428 | B1 | * | 4/2003 | Huang et al. ............... 257/706 |
| 6,580,167 | B1 | * | 6/2003 | Glenn et al. ................ 257/718 |
| 6,667,546 | B2 | * | 12/2003 | Huang et al. ............... 257/691 |
| 2003/0128520 | A1 | * | 7/2003 | Yang .......................... 361/704 |

* cited by examiner

Primary Examiner—Boris Chervinsky
(74) Attorney, Agent, or Firm—Mikio Ishimaru

(57) ABSTRACT

A method for fabricating a semiconductor device heat spreader from a unitary piece of metallic material. The metallic material is stamped to form a unitary heat spreader having an upper heat dissipation region, a lower substrate contact region, and supports connecting the upper heat dissipation region and the lower substrate contact region. A recess is formed within the supports and the upper and lower regions for receiving a semiconductor device.

24 Claims, 17 Drawing Sheets

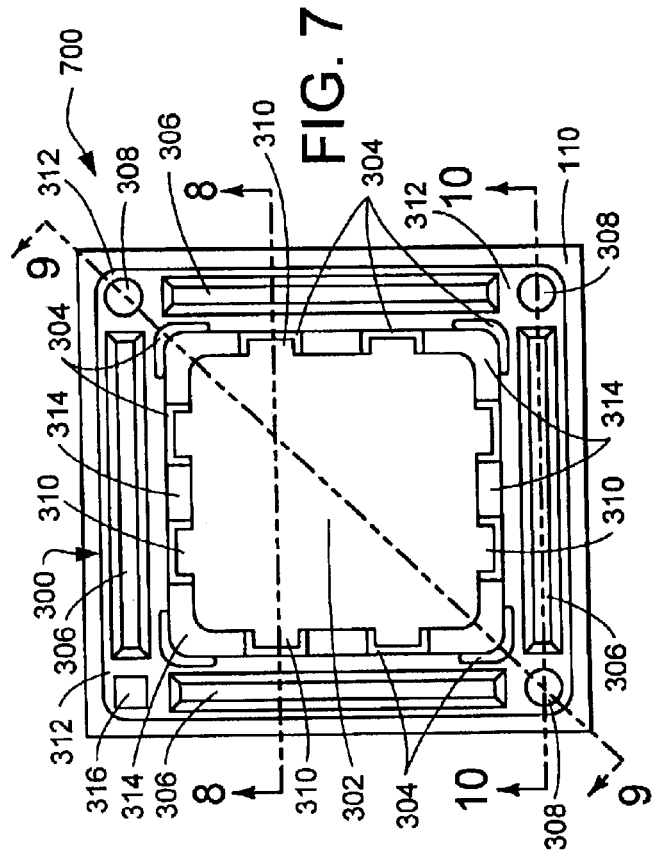
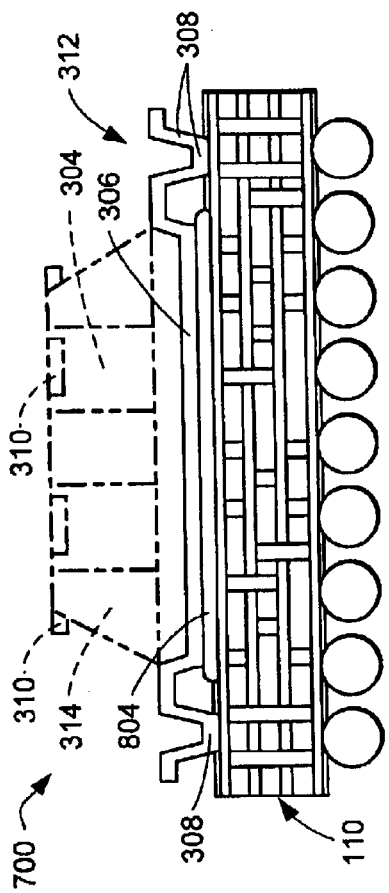
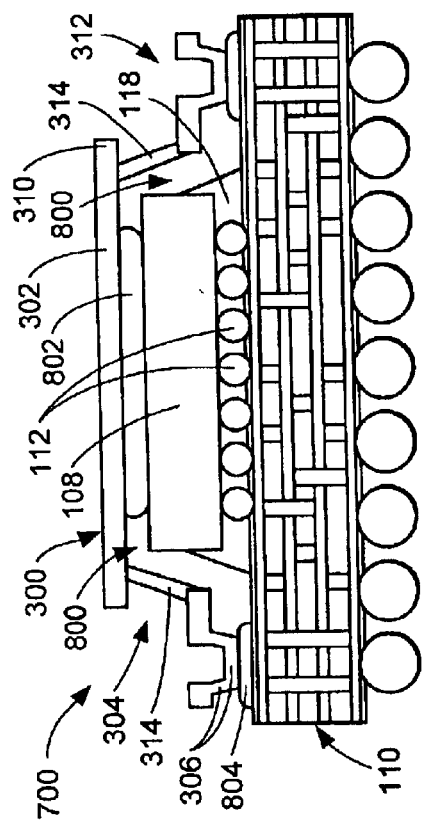
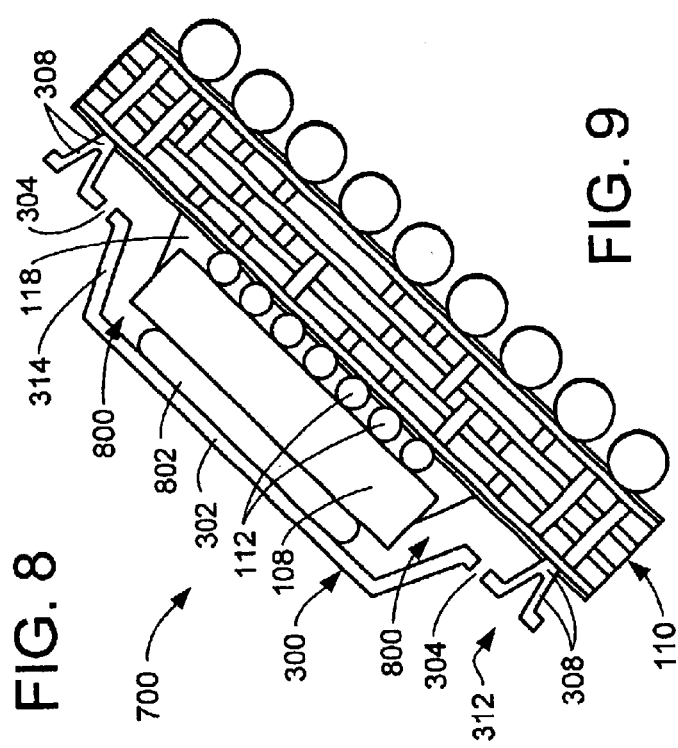

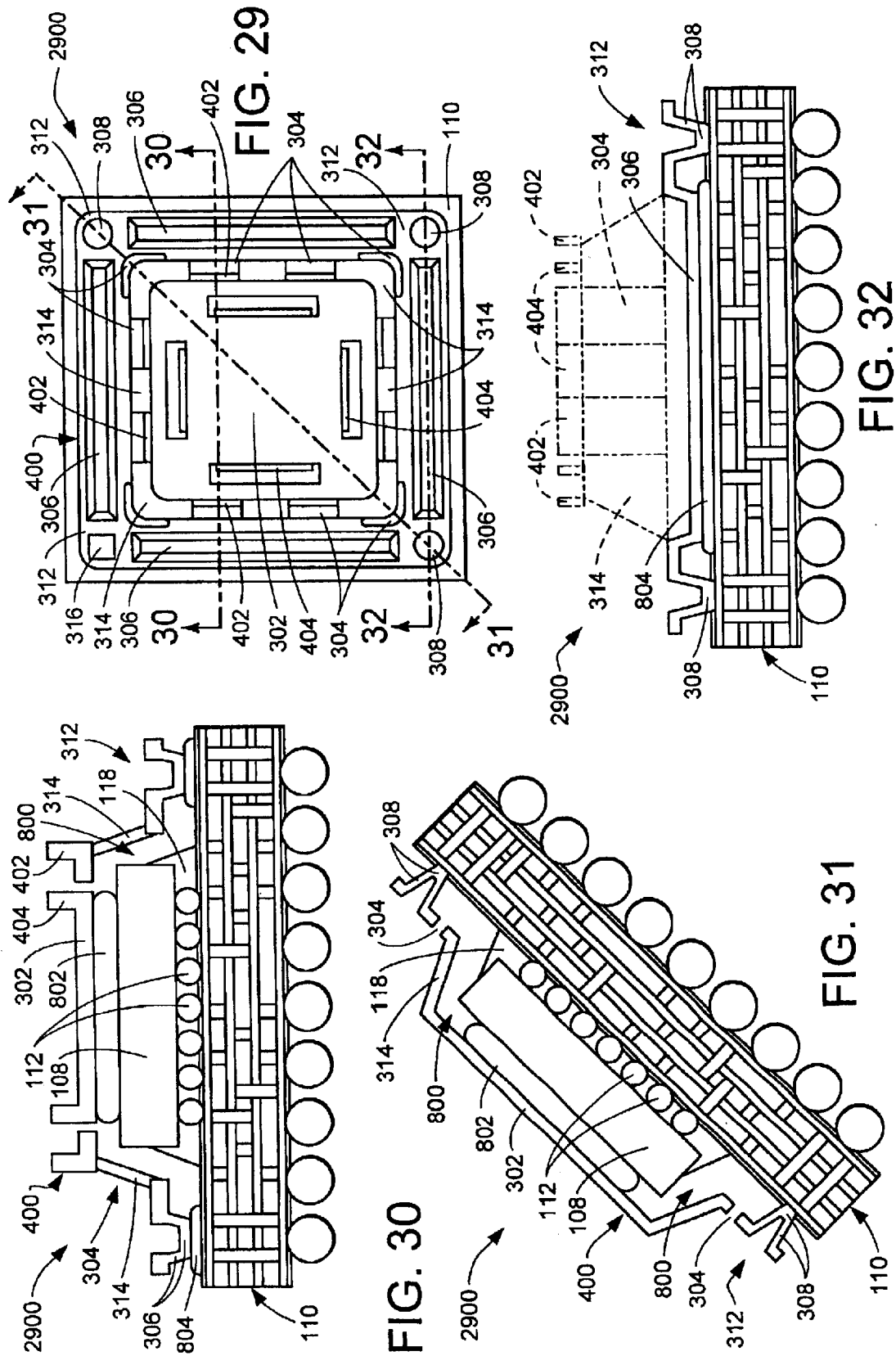

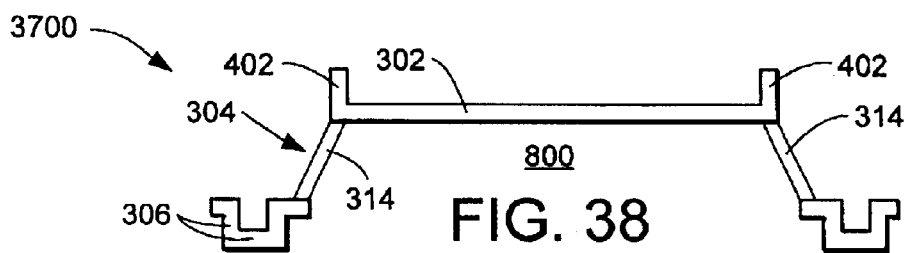
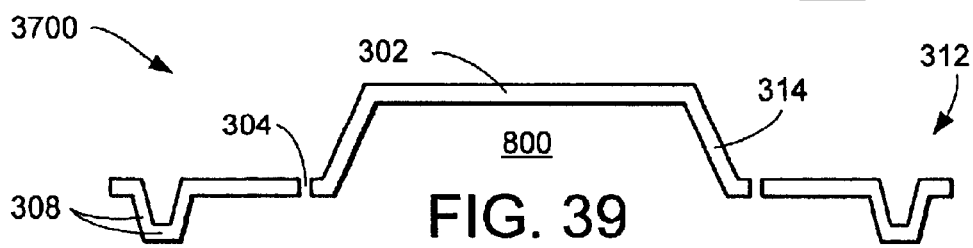
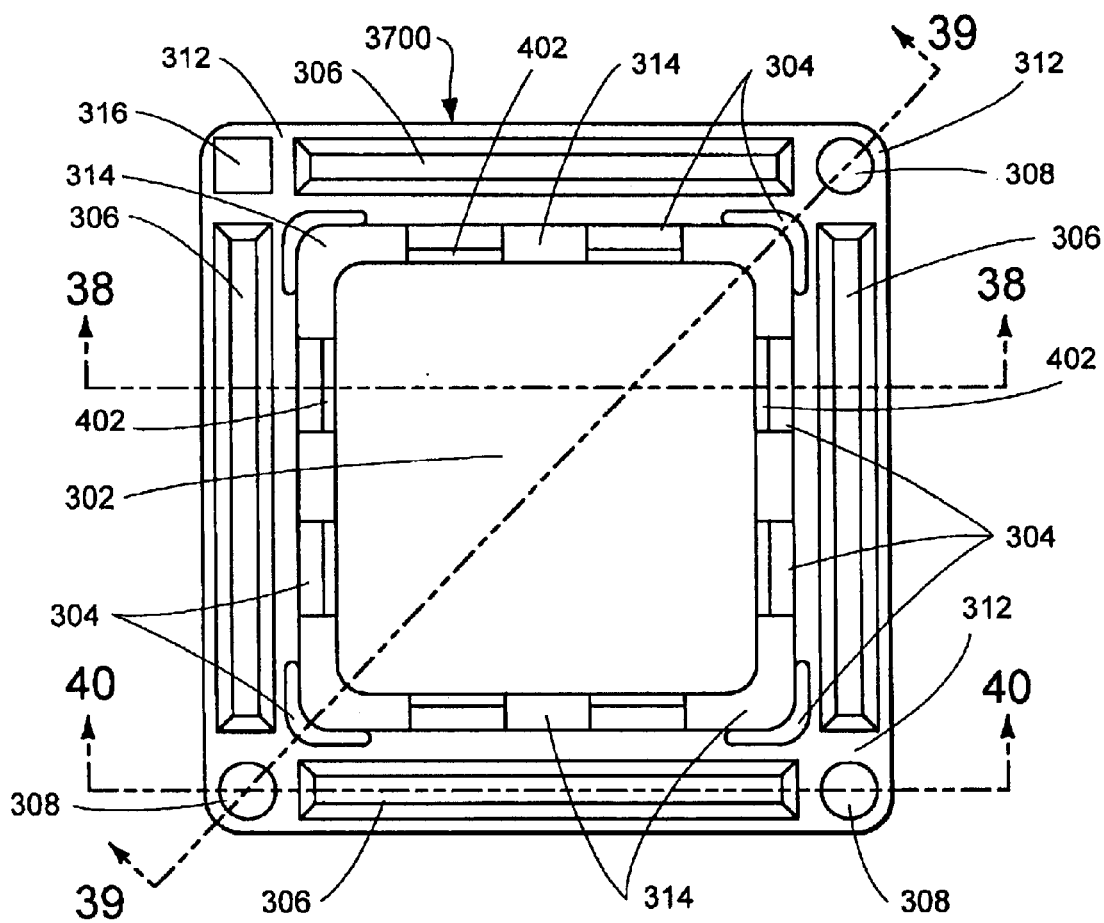
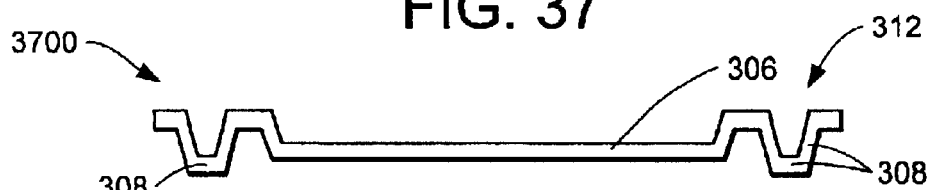

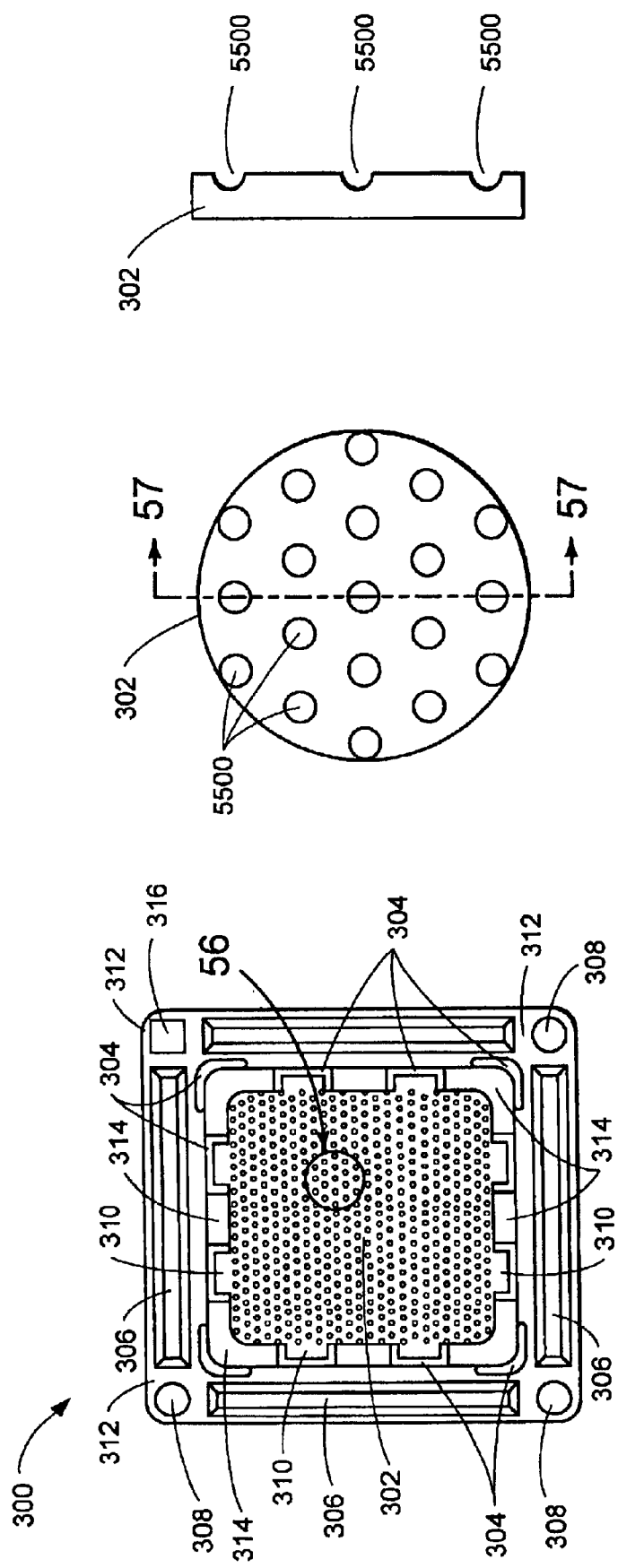

5800

```
┌─────────────────────────────────────────────────────┐
│                                                     │
│      PROVIDING A UNITARY PIECE OF METALLIC MATERIAL │
│                        5802                         │
│                                                     │
└─────────────────────────────────────────────────────┘
                           │
┌─────────────────────────────────────────────────────┐
│ STAMPING THE UNITARY PIECE OF METALLIC MATERIAL TO FORM │
│     A UNITARY HEAT SPREADER HAVING AN UPPER HEAT    │
│   DISSIPATION REGION, A LOWER SUBSTRATE CONTACT REGION, │
│   SUPPORTS CONNECTING THE UPPER HEAT DISSIPATION REGION │
│   AND THE LOWER SUBSTRATE CONTACT REGION, AND A RECESS  │
│     WITHIN THE SUPPORTS AND THE UPPER AND LOWER REGIONS │
│       FOR RECEIVING A SEMICONDUCTOR DEVICE THEREIN  │
│                        5804                         │
└─────────────────────────────────────────────────────┘
```

FIG. 58

HEAT SPREADERS, HEAT SPREADER PACKAGES, AND FABRICATION METHODS FOR USE WITH FLIP CHIP SEMICONDUCTOR DEVICES

CROSS-REFERENCE TO RELATED APPLICATION(S)

This application claims the benefit of U.S. Provisional Patent Application serial No. 60/420,488 filed Oct. 21, 2002, and the subject matter thereof is hereby incorporated herein by reference thereto.

TECHNICAL FIELD

The present invention relates generally to methods and apparatus for the fabrication of integrated circuit devices, and more particularly to improved flip chip heat spreader structures and packages having better performance and lower fabrication costs.

BACKGROUND ART

In the electronics industry, a continuing objective is to further and further reduce the size of electronic devices with a simultaneous increase in performance and speed. Cellular telephones, personal data devices, notebook computers, camcorders, and digital cameras are but a few of the consumer products that require and benefit from this ongoing miniaturization of their sophisticated electronics.

Integrated circuit packages for such complex electronic systems typically have a large number of interconnected integrated circuit chips. The integrated circuit chips are usually made from a semiconductor material such as silicon or gallium arsenide. Photolithographic techniques are used to form the various semiconductor devices in multiple layers on the integrated circuit chips. After manufacture, the integrated circuit chips are typically incorporated into packages that may contain one or several such chips. These chip packages or modules are then typically mounted on printed circuit wiring boards.

In conventional multi-chip modules, a number of semiconductor devices are packed in close proximity within a single package. This eliminates individual packages for each of the semiconductor devices, improves electrical performance, and reduces the overall board space occupied by the devices.

Due to the increase in the packing density, however, the power density (heat output) of the multi-chip module is typically higher than when separately packaged. This requires more elaborate thermal design and thermal management structures to keep the device temperatures within acceptable ranges.

In conventional multi-chip modules, the devices are connected to a substrate, and electrical connections among the devices are accomplished within the substrate. One of the technologies used to connect the devices to the substrate is called "flip chip" or face down bonding, and employs the well-known controlled collapse chip connection (or "C4") bonding technology. With this technology, solder bumps are first formed at the chip terminals. Subsequently, the semiconductor devices are flipped over onto the substrate and the solder bumps are melted to make connection to corresponding terminal pads on the substrate.

Heat management through this structure can be critical. The internal thermal resistance and the thermal performance of the flip chip interconnect technology are determined by a series of heat flow paths. The heat flows first from the semiconductor devices to the body of the semiconductor module or package into which it has been incorporated. The heat then flows to the package surface, and eventually to a heat sink attached to the package surface.

Typically, the top of the package body includes such a heat sink for large-scale heat dissipation. Underneath the surface of the package body is a cavity in which the semiconductor substrate and its associated devices are installed. To enhance the cooling performance, a heat spreader plate is adapted to engage the non-active side of the semiconductor chip or die. A layer of thermal grease or the like is spread between the chip and the heat spreader plate. The heat spreader plate then acts as a heat conductor to improve heat transfer.

Unfortunately, there are drawbacks associated with the use of known heat spreaders for flip chip packages. Among these drawbacks are heat spreader manufacturing costs, complicated assembly processes, and concerns about package reliability. These drawbacks can be understood, for example, by considering common prior art two-piece and single-piece structures.

One such heat spreader structure is a two-piece configuration having a stiffener with a hollow core that surrounds the flip chip, and a metal lid cover that is on top of the stiffener and the flip chip. Normally, the stiffener is thicker than the metal lid. Two different metal forming processes are therefore required to fabricate the two different pieces of the heat spreader from two different raw metal sheets of two different thicknesses.

In another prior art heat spreader structure, a hollow cavity and a lid are formed as a single piece. To form the cavity therein for the chip, a thick metal piece needs to be used, and a substantial amount of material needs to be removed to form the chip cavity. Thus, costly metal forming processes, like milling or casting, have to be employed to fabricate this type of heat spreader.

Additionally, either of the above prior art heat spreader types makes the flip chip packages undesirably bulky.

Consequently, there still remains a need for improved, more economical, more efficient, and more readily manufactured and assembled heat spreaders, heat spreader packages, and fabrication methods for use with flip chip semiconductor devices.

Solutions to these problems have been long sought but prior developments have not taught or suggested any solutions and, thus, solutions to these problems have long eluded those skilled in the art.

DISCLOSURE OF THE INVENTION

The present invention provides a method for fabricating a semiconductor device heat spreader from a unitary piece of metallic material. The metallic material is stamped to form a unitary heat spreader having an upper heat dissipation region, a lower substrate contact region, and supports connecting the upper heat dissipation region and the lower substrate contact region. A recess is formed within the supports and the upper and lower regions for receiving a semiconductor device. This provides improved heat spreader structures, methods, and packages for flip chip semiconductor devices using conventional manufacturing methods.

Certain embodiments of the invention have other advantages in addition to or in place of those mentioned above. The advantages will become apparent to those skilled in the art from a reading of the following detailed description when taken with reference to the accompanying drawings.

BRIEF DESCRIPTION OF THE DRAWINGS

FIG. 7 is a view of a package with the horizontal fin-type heat spreader of FIG. 3 mounted on a substrate;

FIG. 8 is an enlarged cross-sectional view of the structure of FIG. 7 taken on line 8—8 thereof;

FIG. 9 is an enlarged cross-sectional view of the structure of FIG. 7 taken on line 9—9 thereof;

FIG. 10 is an enlarged cross-sectional view of the structure of FIG. 7 taken on line 10—10 thereof;

FIG. 29 is a view of the vertical fin-type heat spreader of FIG. 4 assembled into a package;

FIG. 30 is an enlarged cross-sectional view of the structure of FIG. 29 taken on line 30—30 thereof;

FIG. 31 is an enlarged cross-sectional view of the structure of FIG. 29 taken on line 31—31 thereof;

FIG. 32 is an enlarged cross-sectional view of the structure of FIG. 29 taken on line 32—32 thereof;

FIG. 37 is a view of a vertical fin-type heat spreader, similar to the structures of FIGS. 4 and 33, without the marking area vertical cooling fins and adjacent open slots;

FIG. 38 is a cross-sectional view of the structure of FIG. 37 taken on line 38—38 thereof;

FIG. 39 is a cross-sectional view of the structure of FIG. 37 taken on line 39—39 thereof;

FIG. 40 is a cross-sectional view of the structure of FIG. 37 taken on line 40—40 thereof;

FIG. 55 is a bottom side or reverse view of the horizontal fin-type heat spreader of FIG. 3 with dimples formed in the bottom side of the marking area;

FIG. 56 is an enlarged view of the circled area in FIG. 55 identified therein by the number 56;

FIG. 57 is a cross-sectional view of the structure of FIG. 56 taken on line 57—57 thereof; and FIG. 58 is a flow chart of a method for fabricating a semiconductor device heat spreader in accordance with the present invention.

BEST MODE FOR CARRYING OUT THE INVENTION

Figure 2:
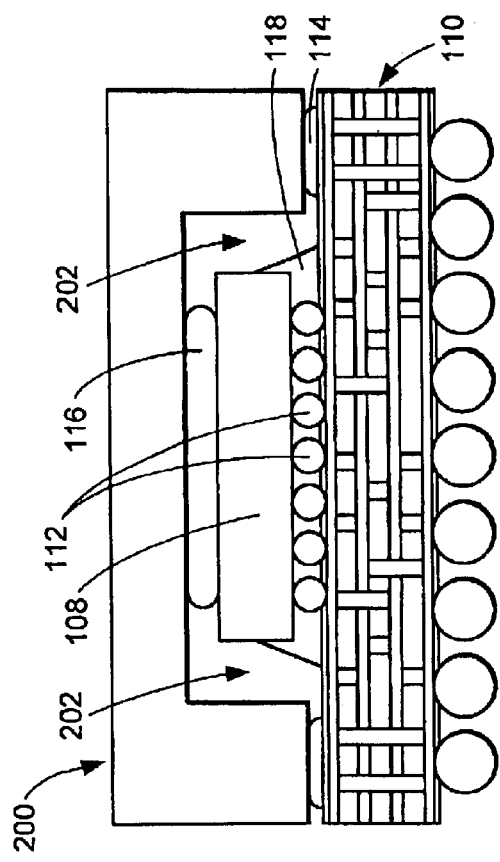
FIG. 2 (PRIOR ART) is a view of a flip chip ball grid array package configuration having a single-piece heat spreader.

In the following description, numerous specific details are given to provide a thorough understanding of the invention.

However, it will be apparent to one skilled in the art that the invention may be practiced without these specific details. In order to avoid obscuring the present invention, some well-known system configurations and process steps are not disclosed in detail.

Likewise, the drawings showing embodiments of the apparatus are semi-diagrammatic and not to scale and, particularly, some of the dimensions are for the clarity of presentation and are shown exaggerated in the FIGS. Also, where multiple embodiments are disclosed and described having some features in common, for clarity and ease of illustration and description thereof like or similar features one to another will ordinarily be described with like reference numerals.

The term "horizontal" as used herein is defined as a plane parallel to the conventional major plane or surface of the semiconductor chip or die substrate, regardless of its orientation. The term "vertical" refers to a direction perpendicular to the horizontal as just defined. Terms, such as "on", "above", "below", "bottom", "top", "side" (as in "sidewall"), "higher", "lower", "over", and "under", are defined with respect to the horizontal plane.

Figure 1:
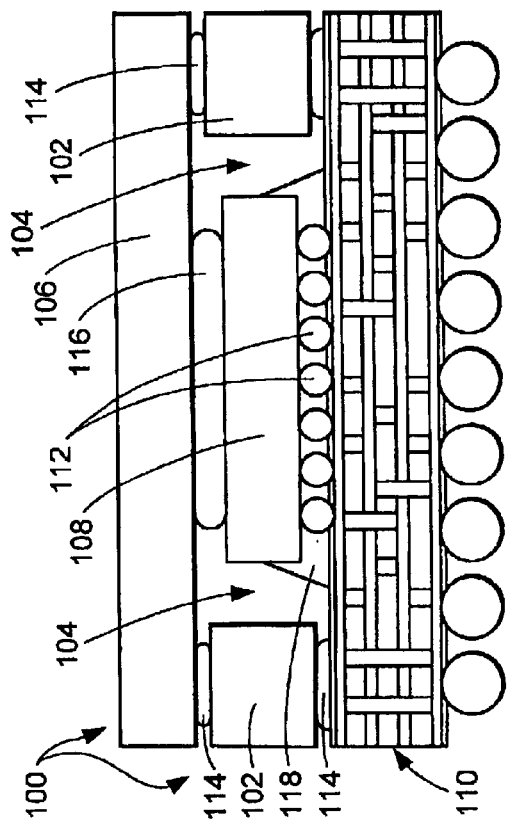
FIG. 1 (PRIOR ART) is a view of a flip chip ball grid array package structure having a two-piece heat spreader.

Referring now to FIG. 1 (PRIOR ART), therein is shown a flip chip ("FC") ball grid array ("BGA") package structure having a two-piece heat spreader 100. The two-piece heat spreader 100 includes a stiffener 102 with a hollow core 104, and a metal lid 106. The metal lid 106 is positioned over the stiffener 102 and covers the hollow core 104. A semiconductor device, such as a flip chip 108, is contained and protected within the hollow core 104 below the metal lid 106 and above a substrate 110. The flip chip 108 is attached and electrically connected to the substrate 110 by an array of solder bumps 112 and a layer of an underfill material 118. The layers of the thermal glue 114 are located between the substrate 110, the stiffener 102, and the metal lid 106. A layer of thermal grease 116 is located between the flip chip 108 and the metal lid 106.

In such a two-piece heat spreader, the stiffener 102 is thicker than the metal lid 106. This requires two different metal forming processes (one on the stiffener 102 and another on the metal lid 106), performed on two raw metal sheets of different thicknesses, to fabricate these two dissimilar pieces of the two-piece heat spreader 100.

Another drawback of prior art configurations like the two-piece heat spreader 100 is the lack of bond line thickness control features. The lack of these features can result in inconsistent adhesive spread coverage on the heat spreader interfaces, such as in the layer of the thermal glue 114 between the substrate 110 and the stiffener 102, and in the layer of the thermal glue 114 between the stiffener 102 and the metal lid 106. Also, sealing defects can occur, such as voids and tilted heat spreader structures, principally occurring during heat spreader attachment and curing processes. Failure to control the coplanality of the heat spreader can also cause problems with solder paste printing onto the substrate 110 for the subsequent BGA ball mount process.

Referring now to FIG. 2 (PRIOR ART), therein is shown another flip chip BGA package configuration having a single-piece heat spreader 200. A substantial amount of material needs to be removed from a rather thick metal piece to form a cavity 202 in the single-piece heat spreader 200 for receiving and containing the flip chip 108. Thus, costly metal forming processes, like milling or casting, have to be employed to fabricate this type of heat spreader.

As will be appreciated, therefore, there continue to be unfortunate shortcomings associated with the use of known heat spreaders for flip chip packages. These shortcomings include not only heat spreader manufacturing costs such as described above, but also result in undesirably bulky BGA packages, complicated assembly processes, and heightened concerns about package reliability.

Figure 4:
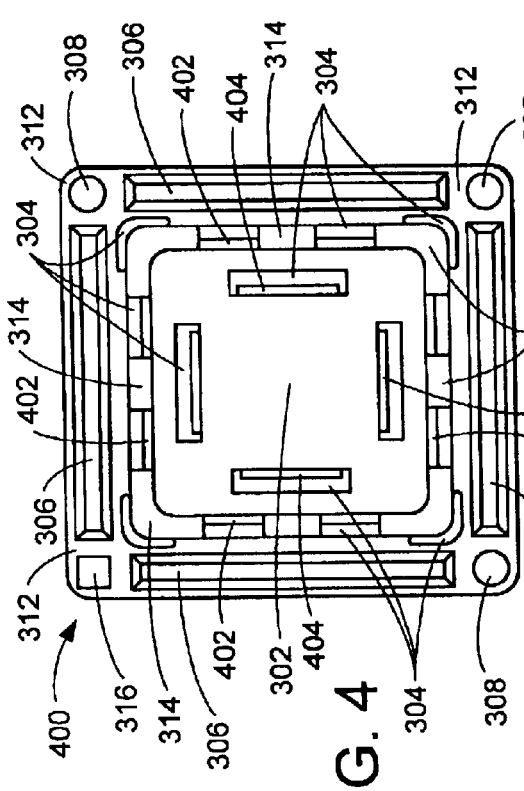
FIG. 4 is a plan view of a vertical fin-type heat spreader in accordance with the present invention.
Figure 6:
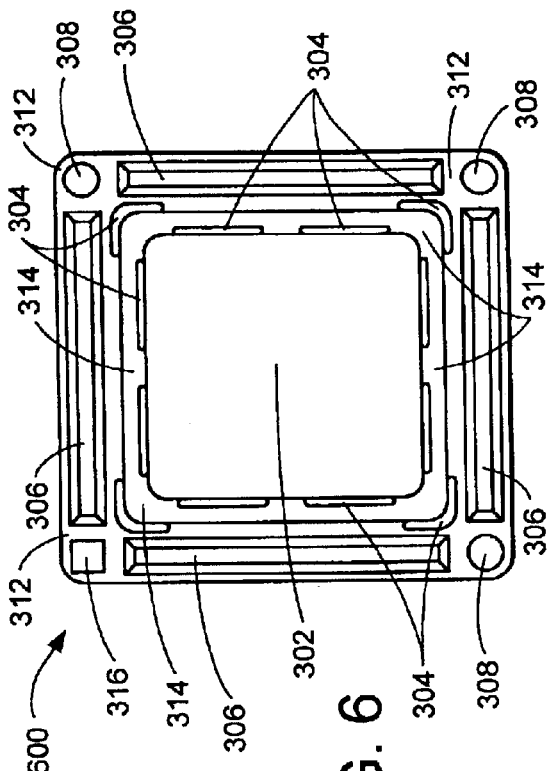
FIG. 6 is a plan view of a finless heat spreader in accordance with the present invention.
Figure 5:
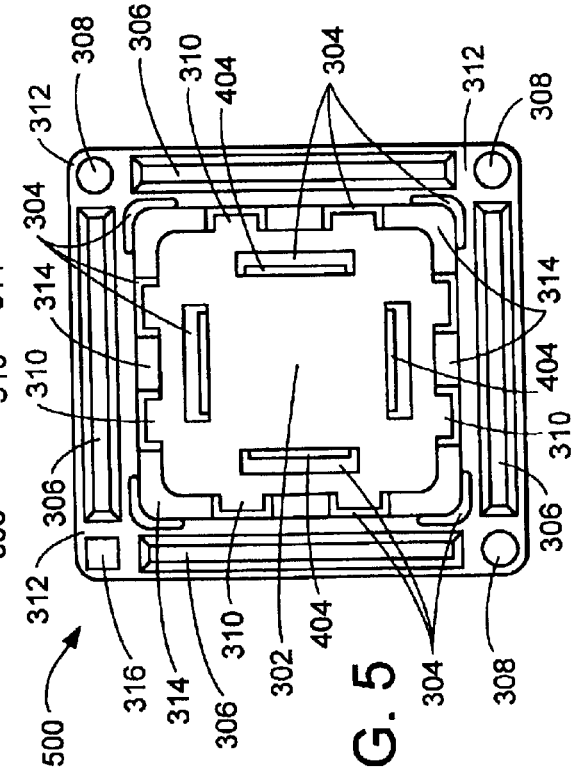
FIG. 5 is a plan view of a horizontal and vertical fin-type heat spreader in accordance with the present invention.

Referring now to FIGS. 3–6, therein are shown respective plan views of a horizontal fin-type heat spreader 300 (FIG. 3), a vertical fin-type heat spreader 400 (FIG. 4), a horizontal and vertical fin-type heat spreader 500 (FIG. 5), and a finless heat spreader 600 (FIG. 6). These heat spreaders are each formed, in a single metal stamping and forming process, from a single, unitary piece of metallic material such as a metallic sheet. They each have a central region, referred to as a labeling or a marking area 302, for receiving therebeneath the flip chip 108 (not shown) in thermal contact therewith in a recess (not shown) therebeneath. They also have open slots 304 of various shapes and in various locations, protrusion pads 306, and contact pads 308. Several of them also possess cooling fins, such as horizontal cooling fins 310 (FIGS. 3 and 5), edge vertical cooling fins 402 (FIG. 4), and marking area vertical cooling fins 404 (FIGS. 4 and 5). The heat spreaders also have a flange region 312 on the periphery, surrounding and beneath the marking area 302, and connected to the marking area 302 by supports 314. One of the contact pads, such as a contact pad 316, may be designated as a pin orientation identifier (e.g., a pin 1 identifier) by having a distinguishable configuration, for example, a different shape (such as a square shape as shown), a different contact pad area, or a hole at the bottom of the contact pad.

As will be developed in greater detail below, the marking areas 302 serve as upper heat dissipation regions, the flange regions 312 serve as lower substrate contact regions, and the open slots and the fins serve as additional heat dissipaters. The flange regions, protrusion pads, and contact pads also serve as base heat spreaders.

Figure 3:
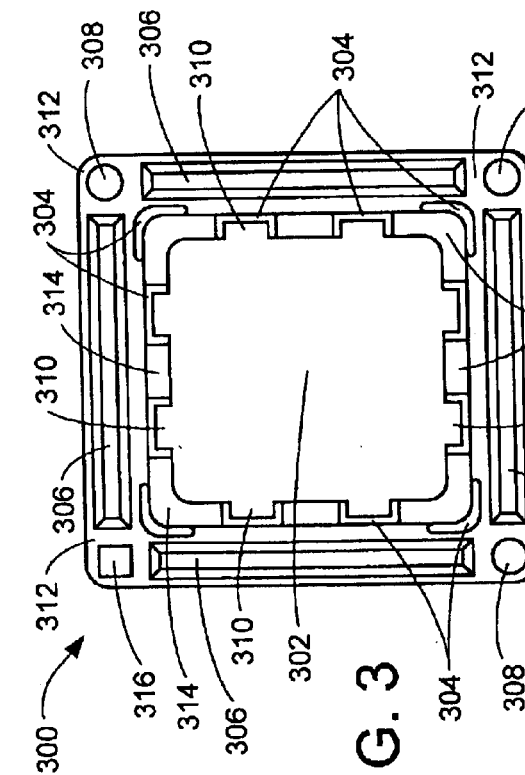
FIG. 3 is a plan view of a horizontal fin-type heat spreader in accordance with the present invention.

Referring now to FIG. 7, therein is shown a package 700 including the horizontal fin-type heat spreader 300 of FIG. 3 mounted upon the substrate 110. The flip chip 108 (not shown, but see FIG. 8) that is contained therebetween is connected in conventional fashion to the substrate 110.

Referring now to FIG. 8, therein is shown a slightly enlarged cross-sectional view of the structure of FIG. 7, taken on line 8—8 thereof. As shown therein, the flip chip 108 is contained in a recess 800 beneath the marking area 302 of the horizontal fin-type heat spreader 300. The marking area 302 is elevated above the flange region 312 of the horizontal fin-type heat spreader 300, and supported by and connected thereto by the supports 314.

The flip chip 108 is connected thermally to the marking area 302 by conventional thermal interface material such as a layer of thermal grease 802 similar to the layer of thermal grease 116 (FIG. 1). Similarly, the protrusion pads 306 are attached by a layer of adhesive/thermal interface material, such as a layer of thermal glue 804, to the substrate 110.

Referring now to FIG. 9, therein is shown a cross-sectional view, similar to FIG. 8, of the structure of FIG. 7, taken on line 9—9 thereof. As can be seen, the contact pads 308 in the flange region 312 are deeper in extent than the protrusion pads 306, such that the contact pads 308 directly contact the substrate 110. In this manner, the contact pads 308 establish the overall height of the horizontal fin-type heat spreader 300 above the substrate 110.

Referring now to FIG. 10, therein is shown a cross-sectional view, similar to FIGS. 8 and 9, of the structure of FIG. 7, taken on line 10—10 thereof. As can be seen, the deeper extent of the contact pads 308, contacting the substrate 110, supports the somewhat shallower (in depth) protrusion pads 306 at a small distance or clearance above the substrate 110. This small clearance accommodates the layer of thermal glue 804 between the protrusion pads 306 and the substrate 110. (For clarity of illustration and to avoid undue detail, the elevational representation of the marking area 302, the open slots 304, the horizontal cooling fins 310, and the supports 314 is sketched only figuratively in phantom in FIG. 10.)

With particular reference to the horizontal fin-type heat spreader 300, as illustrated in conjunction with the package 700 shown in FIGS. 7–10, a number of the features and advantages thereof can now be better understood. For example, the depth of the recess 800 is advantageously designed such that the distance or gap between the backside or top surface of the flip chip 108 and the marking area 302 of the heat spreader, occupied by the layer of thermal grease 802, is minimal. This reduces the thermal resistance of the thermal interface material (e.g., the layer of thermal grease 802) therebetween.

As also shown in FIGS. 7–10, the recess 800 beneath the marking area 302 of the horizontal fin-type heat spreader 300 has a greater lateral extent than the die or flip chip 108. In addition, the support 314 and the flange region 312 are sized to have a horizontal extent that covers virtually the entire underlying surface of the substrate 110. This maximizes heat dissipation from the flip chip 108 and heat transfer between the horizontal fin-type heat spreader 300 and the substrate 110.

Two different types of pads, namely the protrusion pads 306 and the contact pads 308, are formed in the flange region 312. The contact pads 308, which are advantageously located at the four corners of the horizontal fin-type heat spreader 300, have a simple dimple form. The protrusion pads 306, which are located along the flange region 312 between the contact pads 308, are in the form of a groove surrounding the recess 800.

The contact pads 308 have a higher stand off, as described earlier, than the protrusion pads 306, for example by an extent of 0.025 mm–0.05 mm. The contact pads 308 thus serve to support the heat spreader structure on the substrate 110, and additionally create a constant bond line thickness for the layer of thermal glue 804 connecting between the protrusion pads 306 and the substrate 110.

In assembling the package 700, the thermal interface material (such as the layer of thermal grease 802, or alternatively a thermal adhesive) is disposed over the flip chip 108 with an initial thickness greater than the final gap spacing between the flip chip 108 and the marking area 302. This assures a full and continuous layer of thermal interface material, and broader and more effective coverage of the thermal interface material after the package 700 is fully assembled.

Similarly, the adhesive/thermal interface material (such as the layer of thermal glue 804) for the protrusion pads 306 is initially disposed over the projected region of the protrusion pads 306 on the substrate 110 with an initial thickness greater than the final gap spacing, and with a width larger than the corresponding groove width of the protrusion pads 306. Then, after final assembly of the package 700, a good, continuous, and constant gap, as well as broader coverage of the adhesive/thermal interface material, is assured between the protrusion pads 306 and the substrate 110.

The open slots 304 fulfill several functions. They afford stress relief for the heat spreader, both for thermal stresses when in service and for residual stresses resulting from the metal stamping and forming process. The open slots 304 also provide access for cooling air to circulate through the heat spreader to enhance the heat removal performance and efficiency thereof.

The horizontal cooling fins 310 augment the dissipation of heat to the air by providing exposed surfaces extending freely away from the main body portions of the heat spreader.

In addition to support and heat transfer functions, the contact pads 308 also enable direct electrical contact to substrate ground pads (not shown) when desired.

Figure 11:
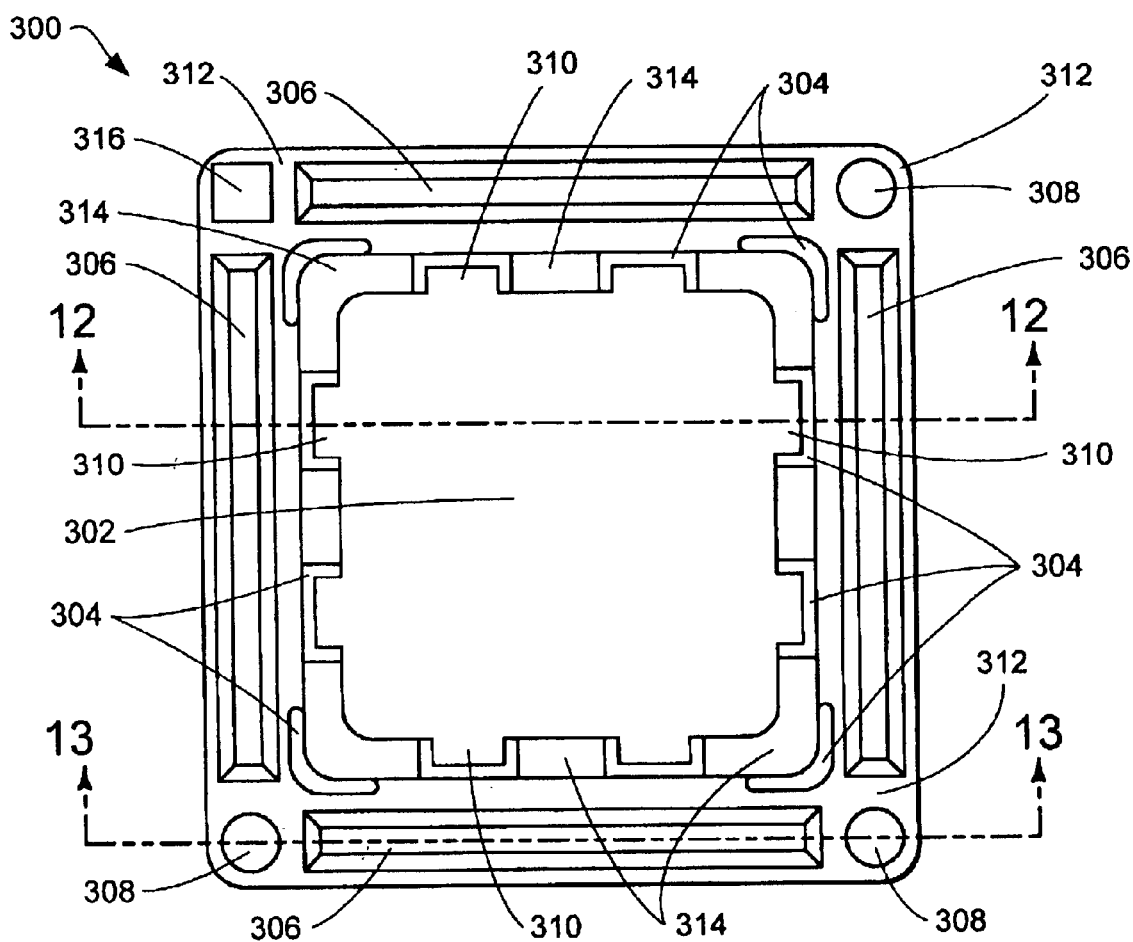
FIG. 11 is an enlarged view of the horizontal fin-type heat spreader of FIGS. 3 and 7.

Referring now to FIG. 11, therein is shown an enlarged view of the horizontal fin-type heat spreader 300 shown in FIGS. 3 and 7.

Figure 12:
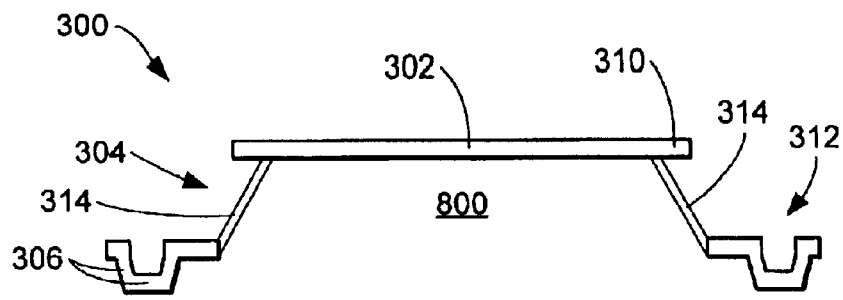
FIG. 12 is a cross-sectional view of the structure of FIG. 11 taken on line 12—12 thereof.

Referring now to FIG. 12, therein is shown a cross-sectional view of the structure of FIG. 11 taken on line 12—12 thereof. The recess 800 below the marking area 302 and within the flange region 312 is clearly shown.

Figure 13:
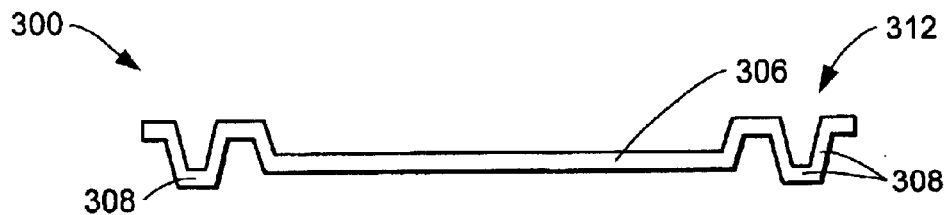
FIG. 13 is a cross-sectional view of the structure of FIG. 11 taken on line 13—13 thereof.

Referring now to FIG. 13, therein is shown a cross-sectional view of the structure of FIG. 11 taken on line 13—13 thereof.

Figure 14:
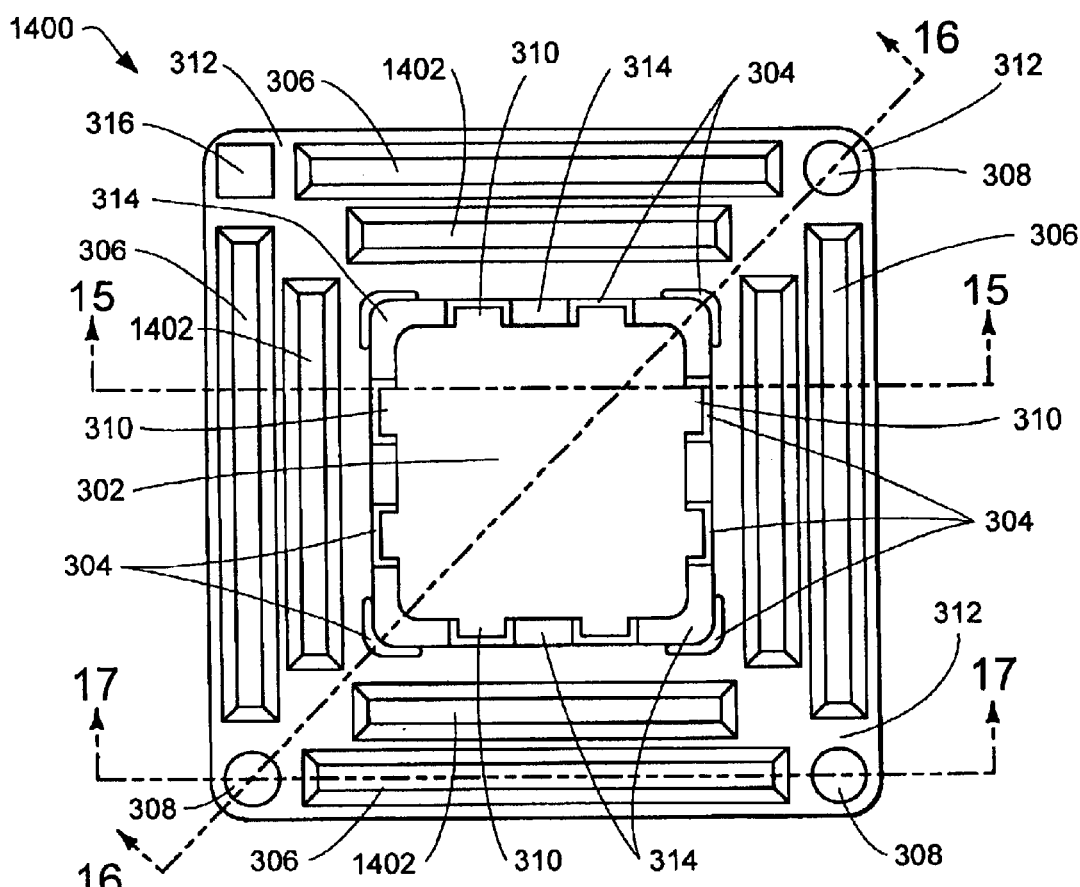
FIG. 14 is a view of a horizontal fin-type heat spreader with additional thermal contact grooves or protrusion pads.

Referring now to FIG. 14, therein is shown a horizontal fin-type heat spreader 1400, similar to the horizontal fin-type heat spreader 300 (FIG. 11), but provided with additional thermal contact grooves or protrusion pads 1402 to afford more thermal contact to the substrate 110 (not shown). As will be evident, the configuration and function of the protrusion pads 1402 are basically the same as that of the protrusion pads 306, with appropriate overall scaling of the dimensions of the horizontal fin-type heat spreader 1400 as needed to accommodate the intended underlying substrate (not shown) and semiconductor flip chip (not shown).

Figure 15:
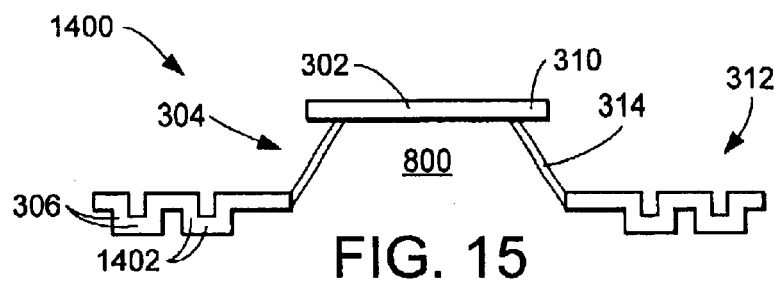
FIG. 15 is a cross-sectional view of the structure of FIG. 14 taken on line 15—15 thereof.
Figure 16:
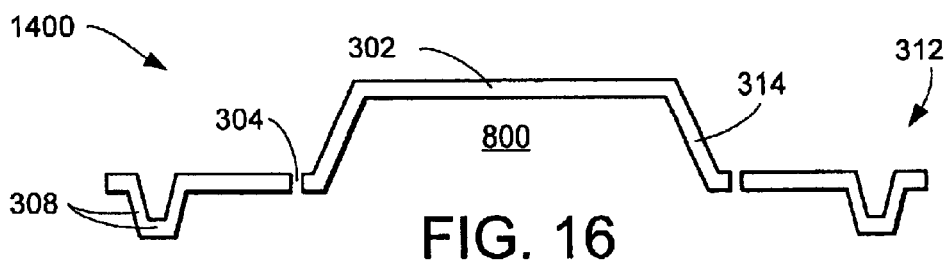
FIG. 16 is a cross-sectional view of the structure of FIG. 14 taken on line 16—16 thereof.
Figure 17:
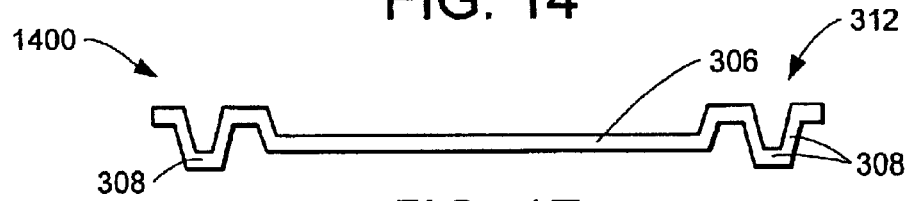
FIG. 17 is a cross-sectional view of the structure of FIG. 14 taken on line 17—17 thereof.

Referring now to FIGS. 15–17, therein are shown cross-sectional views of the structure shown in FIG. 14, taken on respective cross-sectional lines 15—15, 16—16, and 17—17 thereof.

Figure 18:
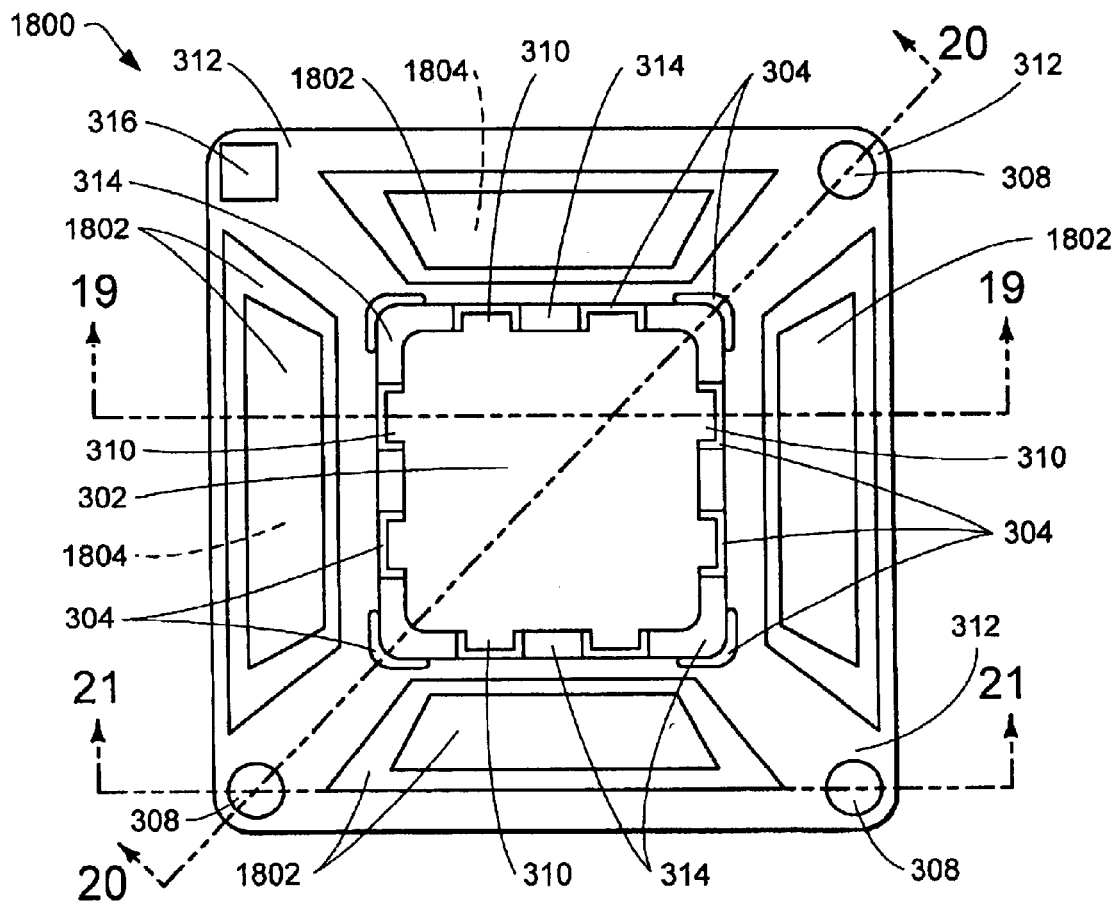
FIG. 18 is a view of a horizontal fin-type heat spreader with enhanced thermal contact structures.

Referring now to FIG. 18, therein is shown a horizontal fin-type heat spreader 1800 similar to the horizontal fin-type heat spreader 1400 (FIG. 14), also having enhanced thermal contact structures for the underlying substrate (not shown). However, rather than a plurality of adjacent protrusion pads, such as the protrusion pads 306 and 1402 (FIG. 14), the horizontal fin-type heat spreader 1800 has a broad protrusion pad 1802 along each side thereof. To provide the intended enhanced thermal contact to the substrate, an enlarged foot 1804 is provided in the base of each of the broad protrusion pads 1802. The greater horizontal surface area of the enlarged foot 1804 provides a greater contact area on the substrate than is afforded by narrower protrusion pads.

Figure 19:
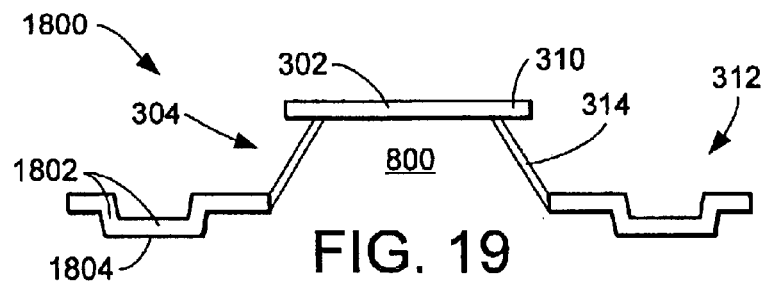
FIG. 19 is a cross-sectional view of the structure of FIG. 18 taken on line 19—19 thereof.
Figure 20:
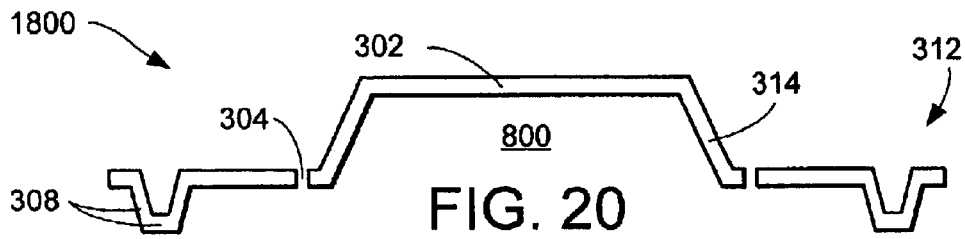
FIG. 20 is a cross-sectional view of the structure of FIG. 18 taken on line 20—20 thereof.
Figure 21:
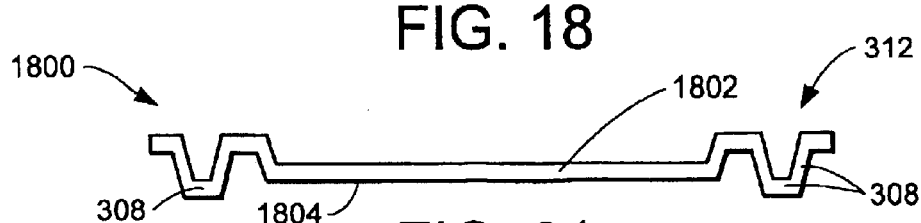
FIG. 21 is a cross-sectional view of the structure of FIG. 18 taken on line 21—21 thereof.

Referring now to FIGS. 19–21, therein are shown cross-sectional views of the structure of FIG. 18 taken respectively on lines 19—19, 20—20, and 21—21 thereof.

Figure 22:
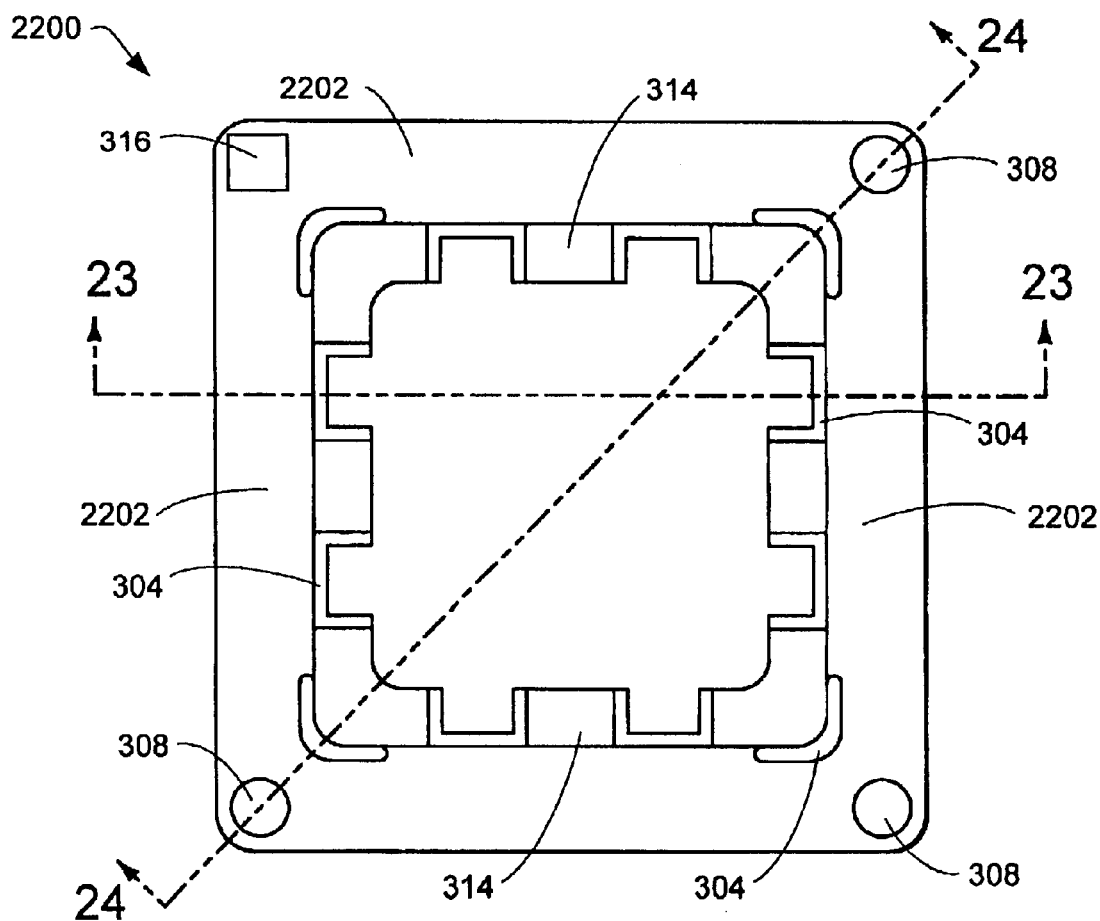
FIG. 22 is a view of a horizontal fin-type heat spreader having a broad flange region for enhancing the thermal transfer contact area.

Referring now to FIG. 22, therein is shown a horizontal fin-type heat spreader 2200 having a broad flange region 2202 that affords still another structural configuration for enhancing the thermal transfer contact area between a heat spreader and the substrate (not shown) to which it will be attached. The lack of thermal contact grooves, such as in the protrusion pads 306, 1402, and 1802, maximizes the proportionate surface area of the broad flange region 2202 in close proximity to the underlying substrate, when attached thereto.

Figure 23:
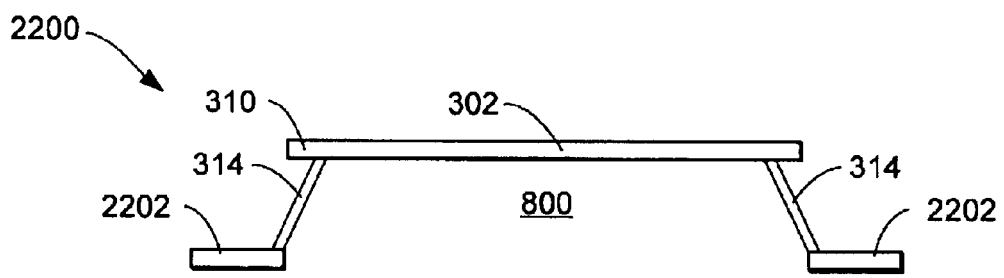
FIG. 23 is a cross-sectional view of the structure of FIG. 22 taken on line 23—23 thereof.
Figure 24:
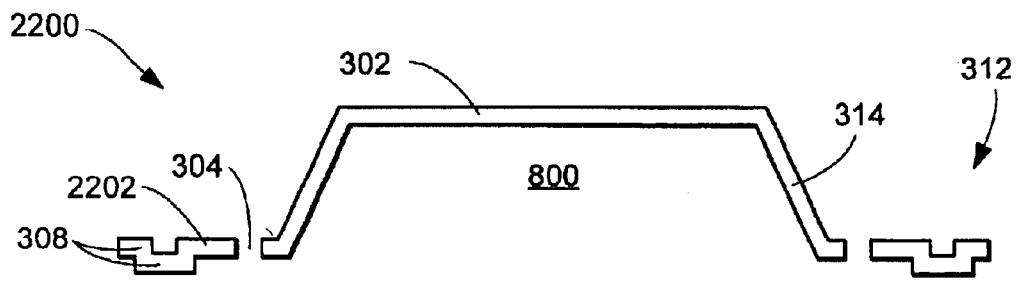
FIG. 24 is a cross-sectional view of the structure of FIG. 22 taken on line 24—24 thereof.

Referring now to FIGS. 23–24, therein are shown cross-sectional views of the structure of FIG. 22 taken respectively on lines 23—23 and 24—24 thereof.

Figure 25:
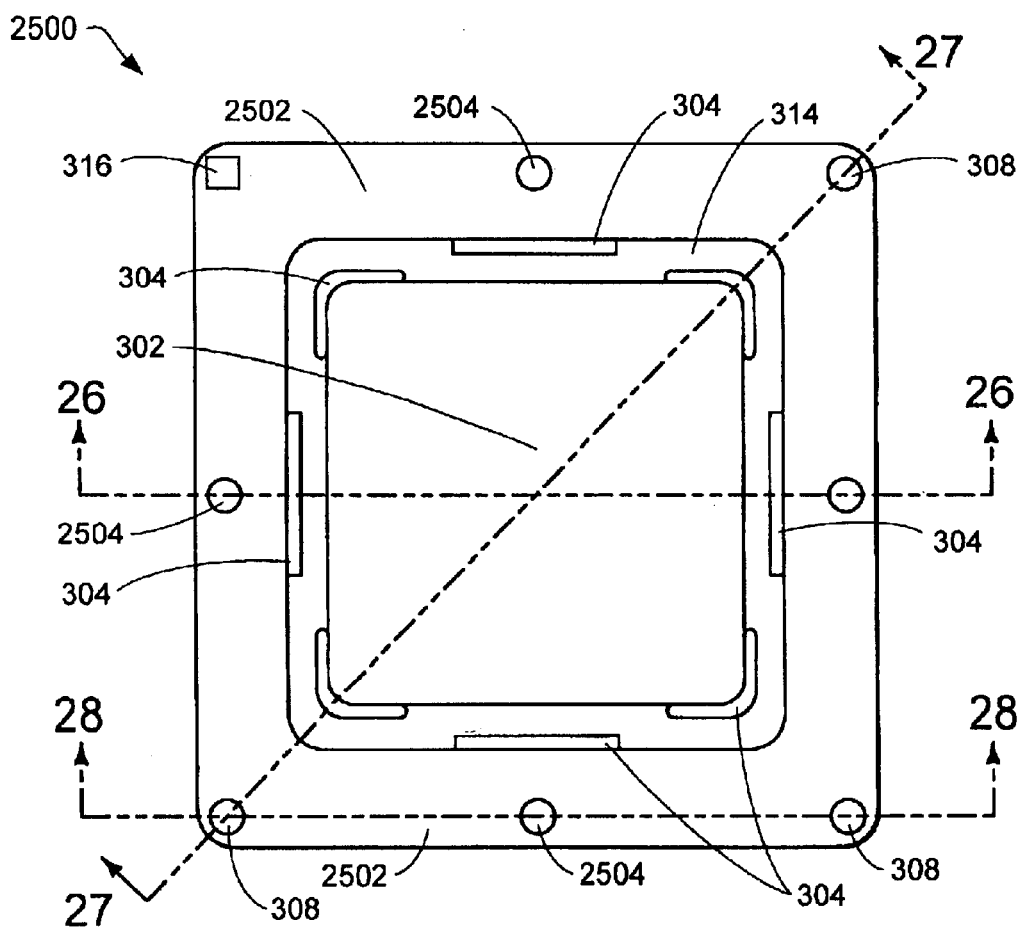
FIG. 25 is a view of a finless heat spreader with a broad flange region and a finless marking area.

Referring now to FIG. 25, therein is shown a finless heat spreader 2500 having a broad flange region 2502 similar to the broad flange region 2202 (FIG. 22), and a finless marking area 302 similar to that in the finless heat spreader 600 (FIG. 6). The finless heat spreader 2500 includes additional contact pads 2504 disbursed in the broad flange region 2502. The additional contact pads 2504 help to strengthen and stiffen the broad flange region 2502, and help maintain the proper thickness of the thermal adhesive (not shown) when spread between the broad flange region 2502 and an underlying substrate (not shown). The additional contact pads 2504 also help resist warpage of the broad flange region 2502, thereby additionally enhancing the uniformity of the adhesive.

Figure 26:
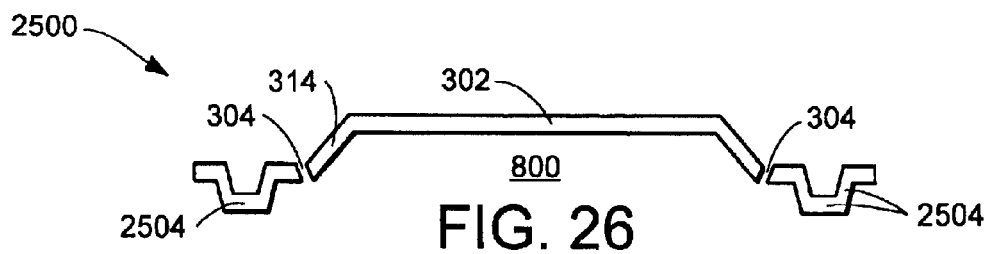
FIG. 26 is a cross-sectional view of the structure of FIG. 25 taken on line 26—26 thereof.
Figure 27:
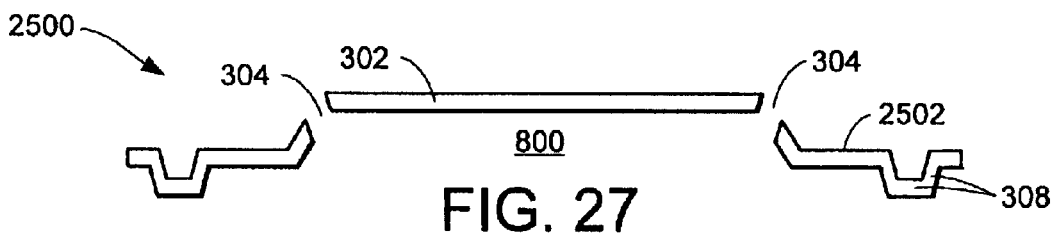
FIG. 27 is a cross-sectional view of the structure of FIG. 25 taken on line 27—27 thereof.
Figure 28:
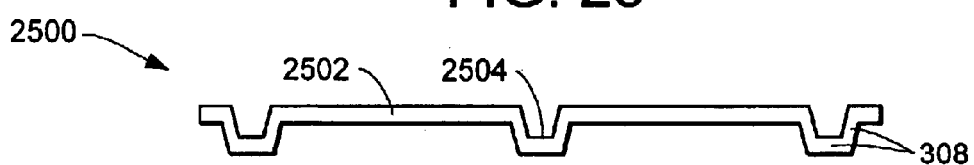
FIG. 28 is a cross-sectional view of the structure of FIG. 25 taken on line 28—28 thereof.

Referring now to FIGS. 26–28, therein are shown cross-sectional views of the structure of FIG. 25 taken respectively on lines 26—26, 27—27, and 28—28 thereof.

Referring now to FIG. 29, therein is shown the vertical fin-type heat spreader 400 (see FIG. 4) assembled into a package 2900. The structure of the vertical fin-type heat spreader 400 and the package 2900 are similar to that of the horizontal fin-type heat spreader 300 (FIG. 3) and the package 700 (FIG. 7), except that the fin-enhanced heat dissipation is accomplished through the edge vertical cooling fins 402 and the marking area vertical cooling fins 404 rather than the horizontal cooling fins 310 (FIGS. 3 and 7). The use of such vertical cooling fins provides a different heat dissipation profile, and may enhance heat dissipation to the air depending upon the final airflow configuration into which the heat spreader is installed. Another advantage of disposing the cooling fins vertically is that additional fins can be employed in the marking area 302 without interfering with the flip chip 108 disposed therebeneath (see FIGS. 30 and 31).

Referring now to FIGS. 30–32, therein are shown cross-sectional views of the structure of FIG. 29 taken on lines 30—30, 31—31, and 32—32 thereof. The assembly of the package 2900 is in most respects similar to that of the package 700. However, due to the additional cooling fins and slots, in particular the marking area vertical cooling fins 404 and the open slots 304 thereadjacent, the extent of the layer of thermal grease 802 may be smaller. Preferably (but not necessarily), the extent of the layer of thermal grease 802 is controlled so as not to block or interfere with the passage of air through the open slots 304 adjacent the marking area vertical cooling fins 404.

Figure 33:
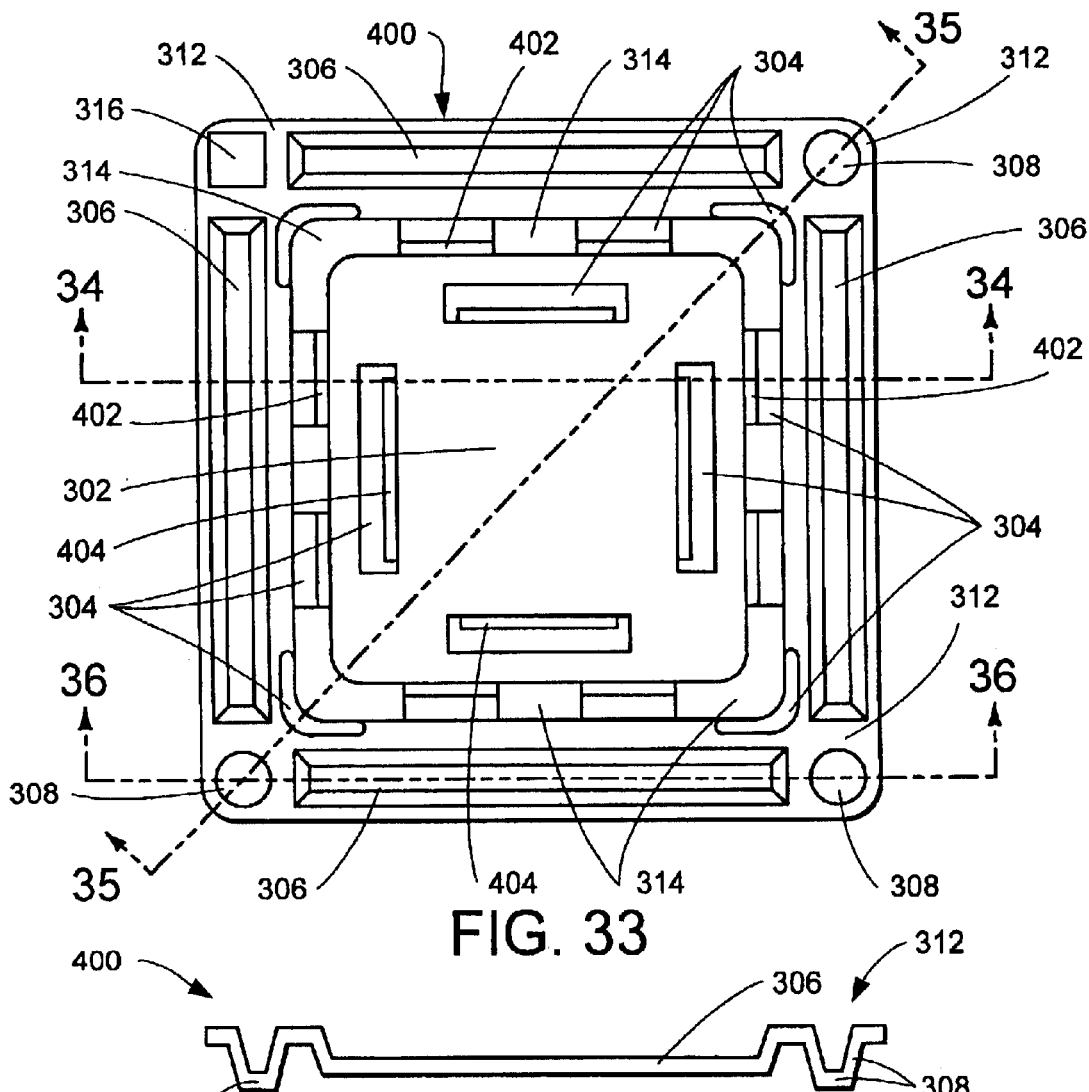
FIG. 33 is an enlarged view of the vertical fin-type heat spreader shown in FIGS. 4 and 29.

Referring now to FIG. 33, therein is shown an enlarged view of the vertical fin-type heat spreader 400 shown in FIGS. 4 and 29.

Figure 34:
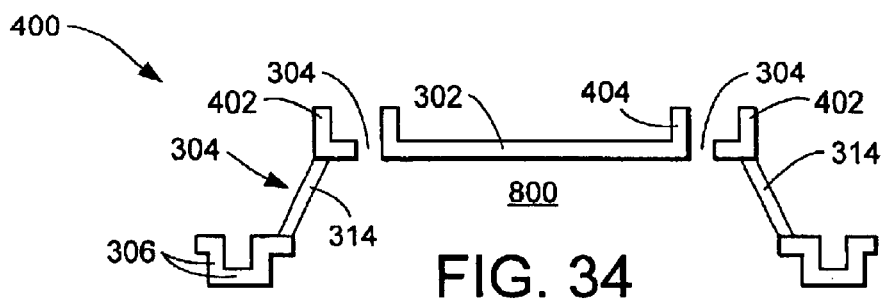
FIG. 34 is a cross-sectional view of the structure of FIG. 33 taken on line 34—34 thereof.
Figure 35:
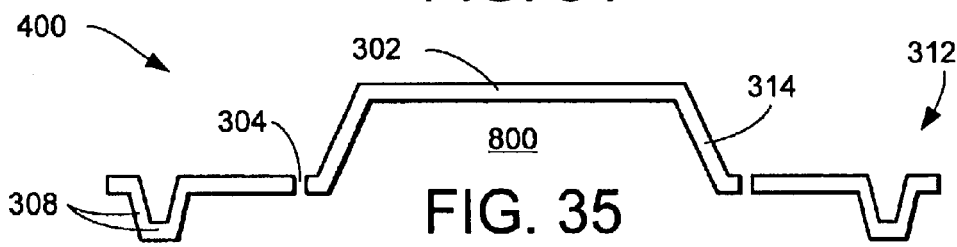
FIG. 35 is a cross-sectional view of the structure of FIG. 33 taken on line 35—35 thereof.
Figure 36:
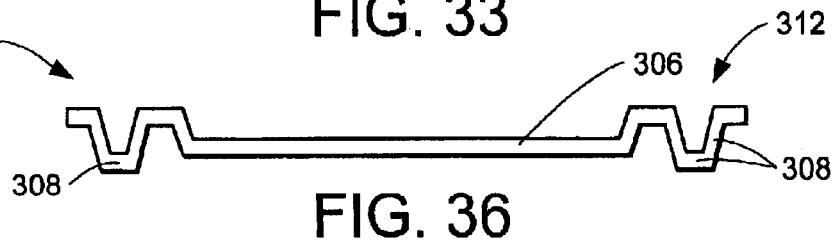
FIG. 36 is a cross-sectional view of the structure of FIG. 33 taken on line 36—36 thereof.

Referring now to FIGS. 34–36, therein are shown cross-sectional views of the structure of FIG. 33 taken on lines 34—34, 35—35, and 36—36 thereof.

Referring now to FIG. 37, therein is shown a vertical fin-type heat spreader 3700 that is similar to the vertical fin-type heat spreader 400 (FIGS. 4 and 33), except that the marking area vertical cooling fins 404 (FIG. 33) and the open slots 304 (FIG. 33) adjacent thereto have been omitted. Instead, the marking area 302 is continuous from one edge to the other, within the flange region 312. This allows the full extent of the marking area 302 to be used for the layer of thermal grease 802 (not shown) for contacting a larger flip chip 108 (not shown) within the recess 800 (see FIG. 38).

Referring now to FIGS. 38–40, therein are shown cross-sectional views of the structure of FIG. 37 taken respectively on lines 38—38, 39—39, and 40—40 thereof.

Figure 41:
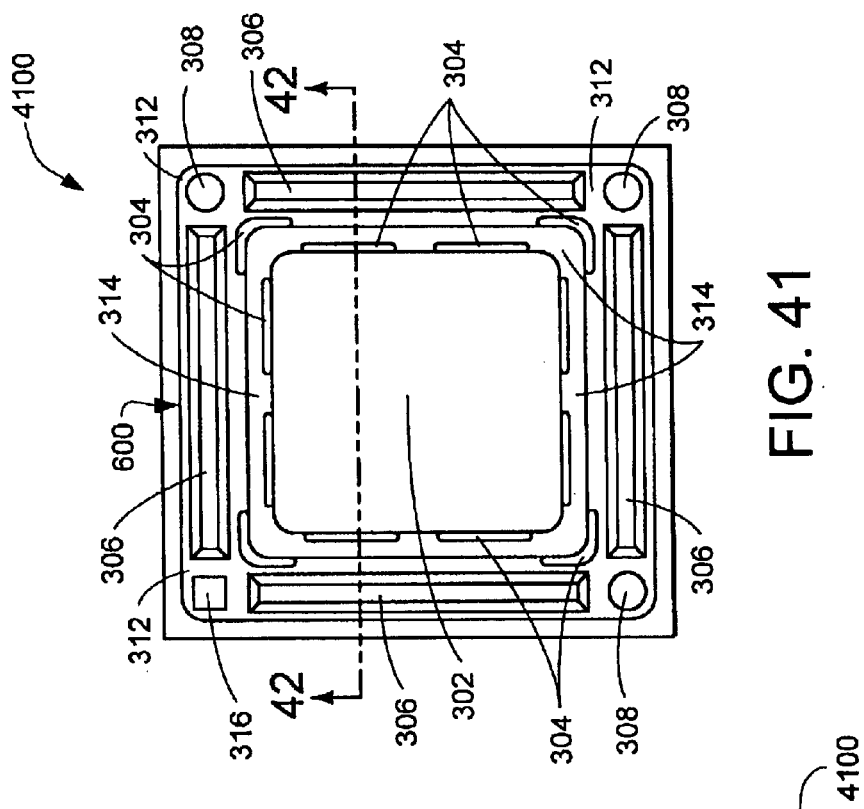
FIG. 41 is a view of the finless heat spreader of FIG. 6 assembled into a package.

Referring now to FIG. 41, therein is shown the finless heat spreader 600 (FIG. 6) assembled onto the substrate 110 and over the flip chip 108 (see FIG. 42), into a package 4100.

Figure 42:
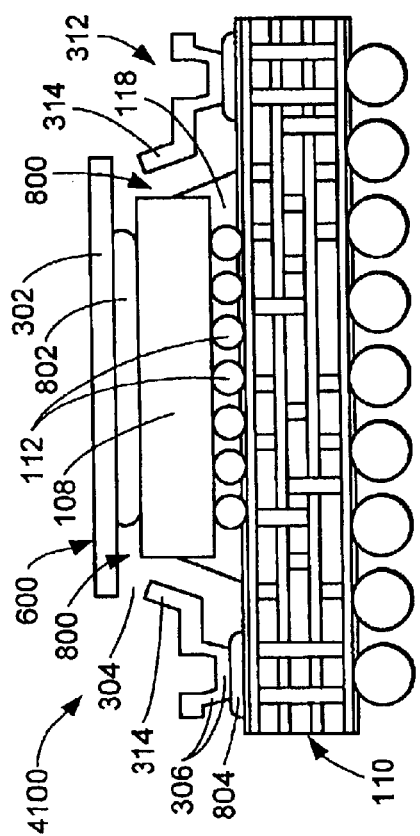
FIG. 42 is an enlarged cross-sectional view of the structure of FIG. 41 taken on line 42—42 thereof.

Referring now to FIG. 42, therein is shown a cross-sectional view of the structure of FIG. 41 taken on line 42—42 thereof.

Figure 43:
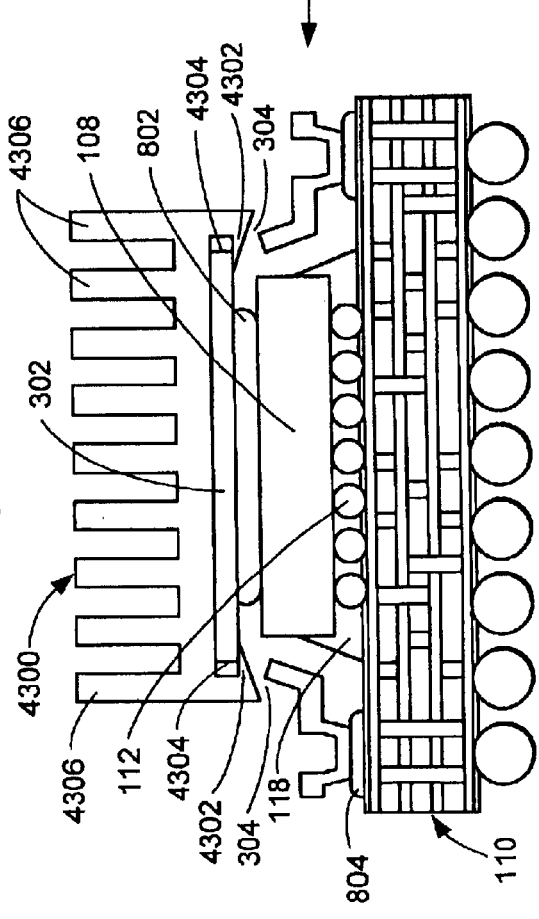
FIG. 43 is a view of the structure of FIG. 42 with a click insert external heat spreader attached.

Referring now to FIG. 43, therein is shown the structure of FIG. 42 onto which is attached a click insert external heat spreader 4300. The click insert external heat spreader 4300 includes edge clips 4302 designed for conveniently and easily clipping onto the edges 4304 of the marking area 302 at the open slots 304 therein. The click insert external heat spreader 4300 includes conventional heat dissipation fins 4306 on the side thereof opposite the edge clips 4302. When attached or clipped in this manner onto the finless heat spreader 600, the click insert external heat spreader 4300 becomes a heat dissipation augmenter, adding optional, additional heat dissipation capacity to the upper heat dissipation region (the marking area 302) of the package 4100.

Figure 44:
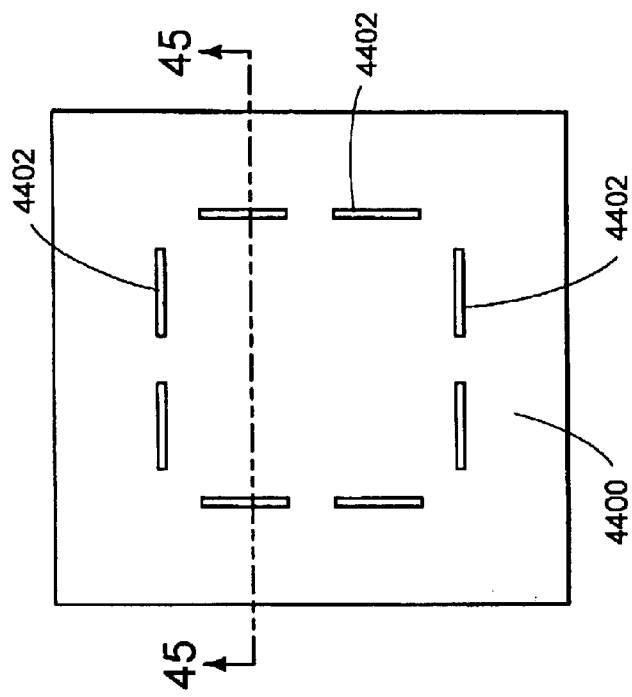
FIG. 44 is a top plan view of an optional heat spreader located above the package of FIG. 41.

Referring now to FIG. 44, therein is shown a top plan view of a finless click insert external heat spreader 4400 having slots 4402 therethrough. To illustrate its use, the finless click insert external heat spreader 4400 is located directly above the package 4100 (not visible in FIG. 44; see FIG. 45).

Figure 45:
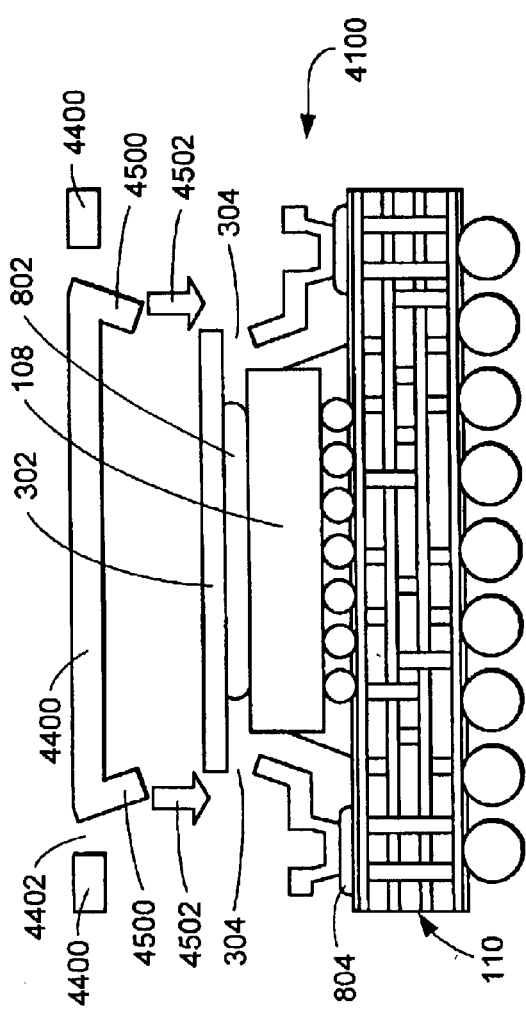
FIG. 45 is a cross-sectional view of the structure of FIG. 44 taken on line 45—45 thereof.

Referring now to FIG. 45, therein is shown a cross-sectional view of the structure of FIG. 44 taken on line 45—45 thereof. As can be seen, slot clips 4500 have been formed in and under the finless click insert external heat spreader 4400 adjacent the slots 4402 therein. The slot clips 4500 are formed in the same metal stamping and forming operation that forms the slots 4402 thereadjacent.

As indicated by arrows 4502, the finless click insert external heat spreader 4400 is then attached to the marking area 302 by moving the finless click insert external heat spreader 4400 downwardly in the direction of the arrows 4502. This causes the slot clips 4500 to engage around the edges of the marking area 302 at the open slots 304 therein. With the finless click insert external heat spreader 4400 thus attached, the exposed surface area for heat dissipation from the package 4100 is substantially increased.

Figure 46:
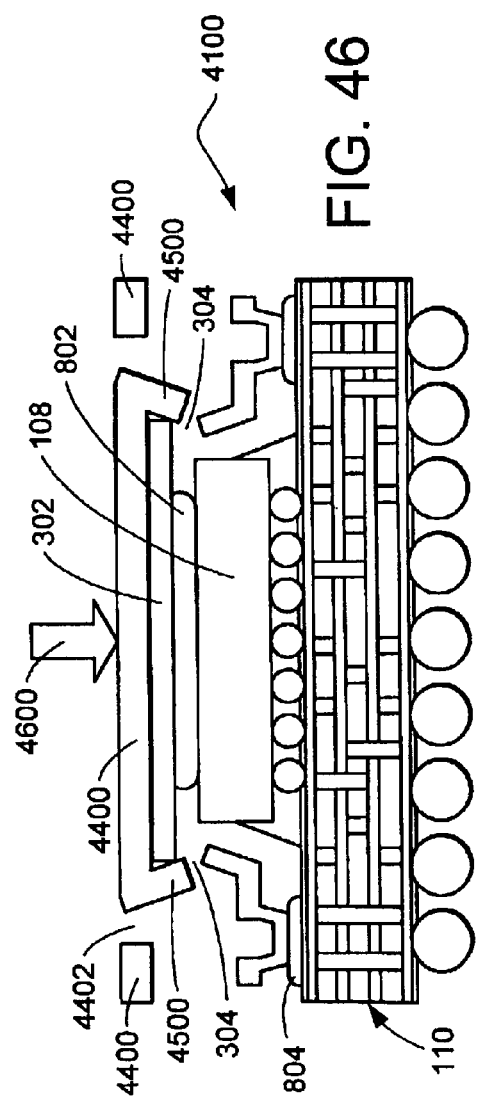
FIG. 46 is a view of the structure of FIG. 45 with the optional heat spreader attached.

Referring now to FIG. 46, therein is shown the structure of FIG. 45 in which the finless click insert external heat spreader 4400 has been attached (clipped onto) the package 4100, as indicated by an arrow 4600.

Figure 47:
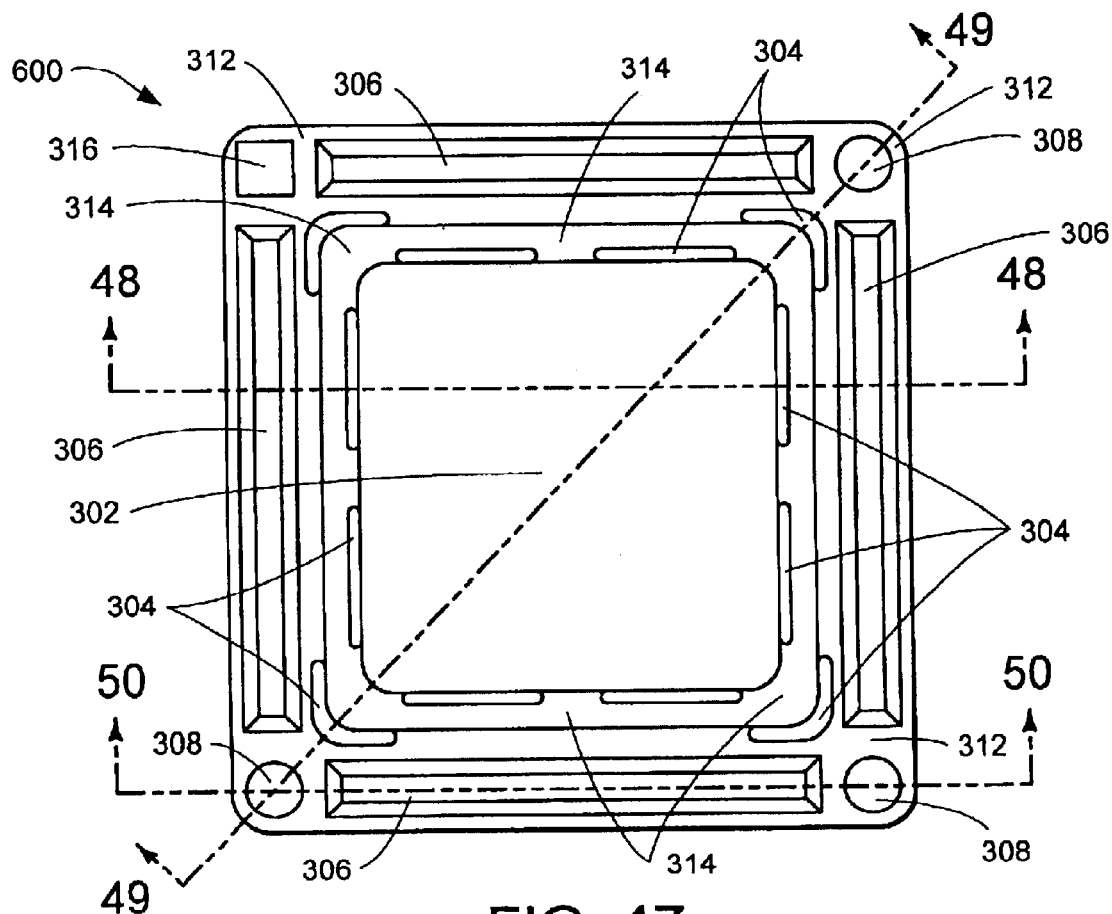
FIG. 47 is an enlarged view of the finless heat spreader of FIG. 6.

Referring now to FIG. 47, therein is shown the finless heat spreader 600 of FIG. 6, enlarged for clarity of illustration.

Figure 48:
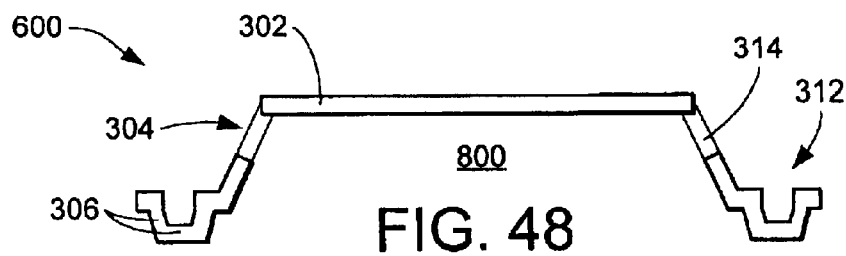
FIG. 48 is a cross-sectional view of the structure of FIG. 47 taken on line 48—48 thereof.
Figure 49:
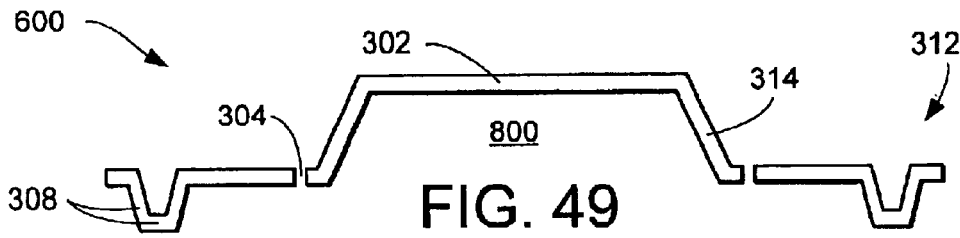
FIG. 49 is a cross-sectional view of the structure of FIG. 47 taken on line 49—49 thereof.
Figure 50:
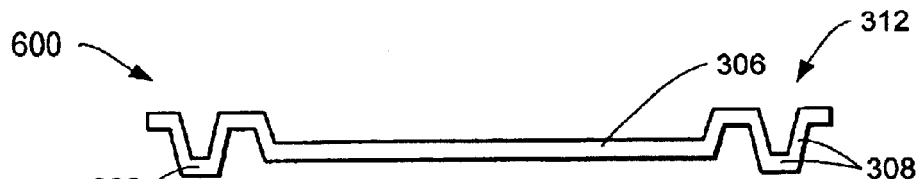
FIG. 50 is a cross-sectional view of the structure of FIG. 47 taken on line 50—50 thereof.

Referring now to FIGS. 48–50, therein are shown cross-sectional views of the structure of FIG. 47 taken respectively on lines 48—48, 49—49, and 50—50 thereof.

Figure 51:
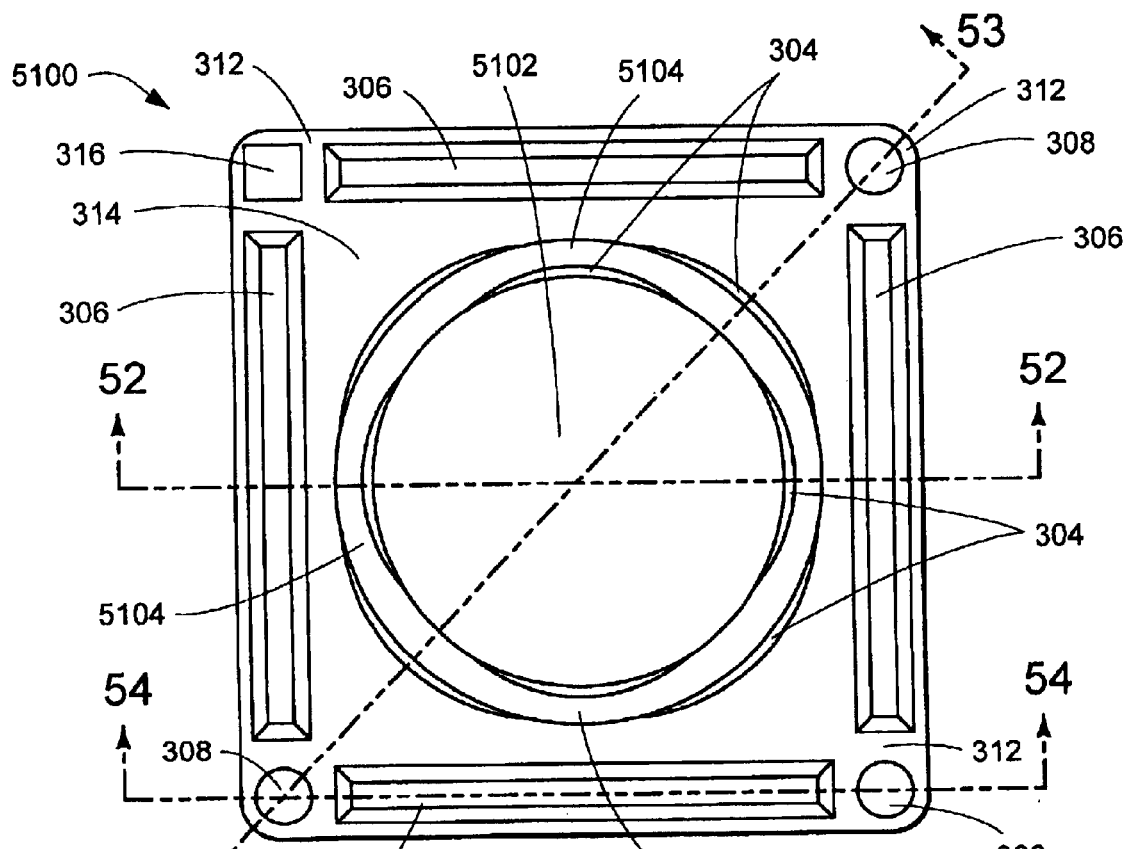
FIG. 51 is a plan view of an alternate embodiment of a finless heat spreader.

Referring now to FIG. 51, therein is shown a plan view of a finless heat spreader 5100. The finless heat spreader 5100 differs from the finless heat spreader 600 (FIG. 47) primarily by having a round marking area 5102 connected to a circular support 5104. It will thus be appreciated that marking area geometries and associated support configurations may be selected as desired, may be adjusted according to the semiconductor chips and substrates onto which the heat spreaders are to be assembled, and may be configured according to the packages into which they are to be incorporated.

Figure 52:
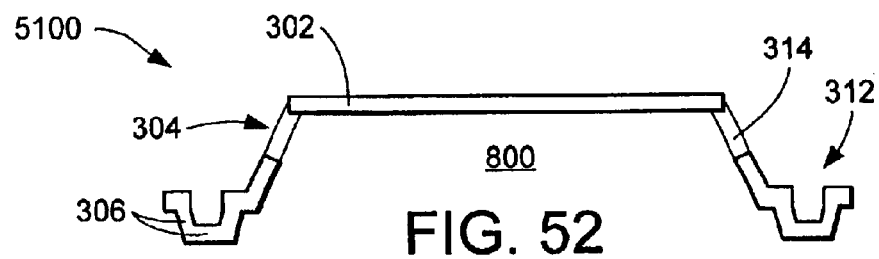
FIG. 52 is a cross-sectional view of the structure of FIG. 51 taken on line 52—52 thereof.
Figure 53:
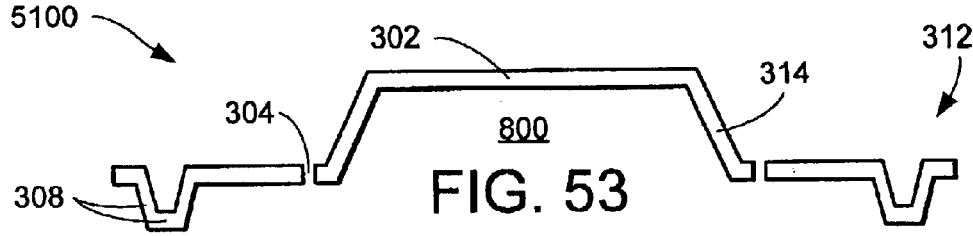
FIG. 53 is a cross-sectional view of the structure of FIG. 51 taken on line 53—53 thereof.
Figure 54:
FIG. 54 is a cross-sectional view of the structure of FIG. 51 taken on line 54—54 thereof.

Referring now to FIGS. 52–54, therein are shown cross-sectional views of the structure of FIG. 51, taken generally on lines 52—52, 53—53, and 54—54 thereof.

Referring now to FIG. 55, therein is shown a bottom side or reverse view of the horizontal fin-type heat spreader 300 (FIG. 3). Dimples 5500, which are optional, have been formed in the bottom side of the marking area 302. The dimples 5500 provide still another mechanism for increasing heat dissipation by forming a surface pattern or configuration that increases the surface area that is in contact with the layer of thermal grease 802 (not shown). An additional advantage is afforded when a thermal adhesive, such as thermal glue, is used in lieu of thermal grease, because the geometry and increased surface area afforded by such patterning of the surface of the marking area 302 will improve adhesion of such a thermal glue. As such, it will be clear that other surface patterns besides the dimples 5500 may be used.

Referring now to FIG. 56, therein is shown an enlarged view of the circled area in FIG. 55, identified by the reference numeral 56 therein.

Referring now to FIG. 57, therein is shown a cross-sectional view of the structure of FIG. 56, taken on line 57—57 thereof.

In fabricating heat spreaders according to the present invention, thicknesses, materials, and dimensions will, of course, be selected according to the particular applications contemplated. Exemplary heat spreaders, for example, have been formed from sheets of copper, copper alloy, or aluminum, of 0.25 mm–1.5 mm in thickness. Such copper or copper alloy materials may also include a nickel or antitarnish coat over the top surface.

Referring now to FIG. 58, therein is shown a flow chart 5800 of a method for fabricating a semiconductor device heat spreader in accordance with the present invention. The method includes a step 5802 of providing a unitary piece of metallic material; and a step 5804 of stamping the unitary piece of metallic material to form a unitary heat spreader having an upper heat dissipation region, a lower substrate contact region, supports connecting the upper heat dissipation region and the lower substrate contact region, and a recess within the supports and the upper and lower regions for receiving a semiconductor device therein.

From the foregoing description and drawings, it will be seen that the present invention provides numerous important advantages.

It provides a cost-effective heat spreader structure because it can be readily formed by conventional metal stamping methods on a single, unitary piece of material.

It provides a heat spreader structure having the capability of controlling the bond line thickness between the heat spreader and the substrate, as well as controlling thermal interface material gaps between the heat spreader and the chip.

It provides a heat spreader structure having a fin configuration that further enhances thermal dissipation efficiency.

It provides a heat spreader structure having openings for allowing cooling air to pass through it.

It provides a heat spreader structure having openings that accommodate thermo-mechanical stresses imposed on the heat spreader and flip chip package.

It provides a heat spreader structure that may have a mechanical locking mechanism to engage an additional heat spreader for further improving thermal performance of the package and/or providing a larger effective marking area.

It provides a heat spreader structure that may have dimples or indentations at the bottom of the heat spreader recess to enhance thermal transfer and the adhesion strength of the thermal interface material between the heat spreader and the flip chip backside area.

It provides a heat spreader that can serve as a shielding plate for electromagnetic interference, and as an additional ground plane to improve electrical performance of the package in high-frequency operation (by, inter alia, reducing switching noise and interference).

The present invention thus provides improved heat spreader structures, methods, and packages for flip chip semiconductor devices. The heat spreaders are formable from a single piece of material by conventional metal stamping methods. Fins, openings, protrusions, slots, pads, grooves, dimples, and indentations in the heat spreader structures provide enhanced heat dissipation efficiency, reduced thermal resistance, constant bond line thickness control, interface material gap control, stress accommodation, and enhanced adhesion. The heat spreaders are more economical, efficient, and easier to manufacture and assemble into heat spreader packages for use with flip chip semiconductor devices.

Accordingly, it has been discovered that the heat spreaders and heat spreader packages for flip chip semiconductor devices of the present invention furnish important and heretofore unavailable solutions, capabilities, and functional advantages for heat management in semiconductor packages. The resulting configurations are straightforward, economical, uncomplicated, highly versatile and effective, use conventional technologies, and are thus readily suited for manufacturing using conventional manufacturing processes and technologies.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations which fall within the spirit and scope of the included claims. All matters hither-to-fore set forth herein or shown in the accompanying drawings are to be interpreted in an illustrative and non-limiting sense.

The invention claimed is:

1. A method for fabricating a semiconductor device heat spreader, comprising:
   providing a unitary piece of metallic material;
   stamping the unitary piece of metallic material to form a unitary heat spreader having:
      an upper heat dissipation region;
      a lower substrate contact region;
      supports connecting the upper heat dissipation region and the lower substrate contact region; and
      a recess within the supports and the upper and lower regions for receiving a semiconductor device therein; and
   forming, in the lower substrate contact region, at least one contact pad having a deeper extent than the lower substrate contact region for contacting a substrate and supporting the lower substrate contact region at a predefined clearance above the substrate to accommodate a layer of adhesive/thermal interface material therebetween and to create a constant bond line thickness therebetween for the layer of adhesive/thermal interface material.

2. The method of claim 1 further comprising forming additional heat dissipaters in the upper heat dissipation region, the additional heat dissipaters being selected from a group consisting of open slots, horizontal cooling fins, vertical cooling fins, and a combination thereof.

3. The method of claim 1 further comprising forming, in the lower substrate contact region, at least one base heat spreader selected from a group consisting of protrusion pads, contact pads, broad flange regions, and a combination thereof.

4. The method of claim 1 further comprising attaching a clip-on heat dissipation augmenter to the upper heat dissipation region.

5. The method of claim 1 further comprising forming a pin orientation identifier in the unitary heat spreader.

6. The method of claim 1 further comprising forming a surface pattern in the upper heat dissipation region.

7. A method for fabricating a semiconductor device heat spreader, comprising:
provide a substrate;
providing a semiconductor device;
providing a unitary piece of metallic material;
stamping the unitary piece of metallic material to form a unitary heat spreader having:
an upper heat dissipation region;
a lower substrate contact region;
supports connecting the upper heat dissipation region and the lower substrate contact region; and
a recess within the supports and the upper and lower regions;
forming, in the lower substrate contact region, at least one contact pad having a deeper extent than the lower substrate contact region for contacting the substrate and supporting the lower substrate contact region at a predefined clearance above the substrate to accommodate a layer of adhesive/thermal interface material therebetween and to create a constant bond line thickness therebetween for the layer of adhesive/thermal interface material;
receiving the semiconductor device within the recess;
thermally coupling the semiconductor device to the upper heat dissipation region; and
adhering the lower substrate contact region to the substrate.

8. The method of claim 7 further comprising forming additional heat dissipaters in the upper heat dissipation region, the additional heat dissipaters being selected from a group consisting of open slots, horizontal cooling fins, vertical cooling fins, and a combination thereof.

9. The method of claim 7 further comprising forming, in the lower substrate contact region, at least one base heat spreader selected from a group consisting of protrusion pads, contact pads, broad flange regions, and a combination thereof.

10. The method of claim 7 further comprising attaching a clip-on heat dissipation augmenter to the upper heat dissipation region.

11. The method of claim 7 further comprising forming a pin orientation identifier in the unitary heat spreader.

12. The method of claim 7 further comprising forming a surface pattern in the upper heat dissipation region.

13. A semiconductor device heat spreader, comprising:
a unitary piece of metallic material stamped into a unitary heat spreader having:
an upper heat dissipation region;
a lower substrate contact region;
in the lower substrate contact region, at least one contact pad having a deeper extent than the lower substrate contact region for contacting a substrate and supporting the lower substrate contact region at a predefined clearance above the substrate to accommodate a layer of adhesive/thermal interface material therebetween and to create a constant bond line thickness therebetween for the layer of adhesive/thermal interface material;
supports connecting the upper heat dissipation region and the lower substrate contact region; and
a recess within the supports and the upper and lower regions for receiving a semiconductor device therein.

14. The heat spreader of claim 13 further comprising additional heat dissipaters in the upper heat dissipation region, the additional heat dissipaters being selected from a group consisting of open slots, horizontal cooling fins, vertical cooling fins, and a combination thereof.

15. The heat spreader of claim 13 further comprising, in the lower substrate contact region, at least one base heat spreader selected from a group consisting of protrusion pads, contact pads, broad flange regions, and a combination thereof.

16. The heat spreader of claim 13 further comprising a clip-on heat dissipation augmenter attached to the upper heat dissipation region.

17. The heat spreader of claim 13 further comprising a pin orientation identifier in the unitary heat spreader.

18. The heat spreader of claim 13 further comprising a surface pattern formed in the upper heat dissipation region.

19. A semiconductor device heat spreader, comprising:
a substrate;
a unitary piece of metallic material stamped into a unitary heat spreader having:
an upper heat dissipation region;
a lower substrate contact region;
in the lower substrate contact region, at least one contact pad having a deeper extent than the lower substrate contact region for contacting a substrate and supporting the lower substrate contact region at a predefined clearance above the substrate to accommodate a layer of adhesive/thermal interface material therebetween and to create a constant bond line thickness therebetween for the layer of adhesive/thermal interface material;
supports connecting the upper heat dissipation region and the lower substrate contact region; and
a recess within the supports and the upper and lower regions;
a semiconductor device received within the recess and thermally coupled to the upper heat dissipation region; and
the lower substrate contact region being adhered to the substrate.

20. The heat spreader of claim 19 further comprising additional heat dissipaters in the upper heat dissipation region, the additional heat dissipaters being selected from a group consisting of open slots, horizontal cooling fins, vertical cooling fins, and a combination thereof.

21. The heat spreader of claim 19 further comprising, in the lower substrate contact region, at least one base heat spreader selected from a group consisting of protrusion pads, contact pads, broad flange regions, and a combination thereof.

22. The heat spreader of claim 19 further comprising a clip-on heat dissipation augmenter attached to the upper heat dissipation region.

23. The heat spreader of claim 19 further comprising a pin orientation identifier in the unitary heat spreader.

24. The heat spreader of claim 19 further comprising a surface pattern formed in the upper heat dissipation region.

* * * * *

UNITED STATES PATENT AND TRADEMARK OFFICE
CERTIFICATE OF CORRECTION

PATENT NO. : 6,775,140 B2 Page 1 of 1
DATED : August 10, 2004
INVENTOR(S) : Shim et al.

It is certified that error appears in the above-identified patent and that said Letters Patent is hereby corrected as shown below:

Column 14,
Line 30, delete "a" and insert therefor -- the --

Signed and Sealed this

Fourteenth Day of December, 2004

JON W. DUDAS
*Director of the United States Patent and Trademark Office*